(12) United States Patent
Yoshihara et al.

(10) Patent No.: US 10,470,312 B2
(45) Date of Patent: Nov. 5, 2019

(54) METHOD FOR FORMING ELECTRICALLY CONDUCTIVE ULTRAFINE PATTERN, ELECTRICALLY CONDUCTIVE ULTRAFINE PATTERN, AND ELECTRIC CIRCUIT

(71) Applicant: DIC CORPORATION, Tokyo (JP)

(72) Inventors: Sunao Yoshihara, Sakura (JP); Haruhiko Katsuta, Sakura (JP); Yoshinori Katayama, Sakura (JP); Jun Shirakami, Takaishi (JP); Akira Murakawa, Takaishi (JP); Wataru Fujikawa, Takaishi (JP); Yukie Saitou, Takaishi (JP)

(73) Assignee: DIC CORPORATION (TOKYO), Tokyo (JP)

( * ) Notice: Subject to any disclaimer, the term of this patent is extended or adjusted under 35 U.S.C. 154(b) by 162 days.

(21) Appl. No.: 14/769,574

(22) PCT Filed: Mar. 6, 2014

(86) PCT No.: PCT/JP2014/055832
§ 371 (c)(1),
(2) Date: Aug. 21, 2015

(87) PCT Pub. No.: WO2014/142007
PCT Pub. Date: Sep. 18, 2014

(65) Prior Publication Data
US 2016/0007477 A1    Jan. 7, 2016

(30) Foreign Application Priority Data

Mar. 12, 2013    (JP) ................ 2013-049042

(51) Int. Cl.
| | |
|---|---|
| *C25D 5/02* | (2006.01) |
| *H05K 3/18* | (2006.01) |
| *C25D 5/56* | (2006.01) |
| *C25D 7/00* | (2006.01) |
| *H05K 1/03* | (2006.01) |
| *H05K 1/09* | (2006.01) |
| *H05K 3/12* | (2006.01) |

(52) U.S. Cl.
CPC ............... *H05K 3/188* (2013.01); *C25D 5/02* (2013.01); *C25D 5/56* (2013.01); *C25D 7/00* (2013.01);
(Continued)

(58) Field of Classification Search
None
See application file for complete search history.

(56) References Cited

U.S. PATENT DOCUMENTS

2004/0203235 A1* 10/2004 Miyakawa ............. C23C 18/06
438/689
2012/0052259 A1*  3/2012 Kotake ............... H01L 51/0013
428/195.1

(Continued)

FOREIGN PATENT DOCUMENTS

| EP | 2620290 A1 | 7/2013 |
|---|---|---|
| JP | 60-246695 A | 12/1985 |

(Continued)

OTHER PUBLICATIONS

International Search Report dated May 27, 2014, issued in counterpart Applicaation No. PCT/JP2014/055832 (1 page).

*Primary Examiner* — Stefanie S Wittenberg
(74) *Attorney, Agent, or Firm* — Westerman, Hattori, Daniels & Adrian, LLP

(57) ABSTRACT

There is provided a method for forming an electrically conductive ultrafine pattern which has an excellent pattern cross-sectional shape is provided by a composite technique including a printing process and a plating process, and furthermore, by imparting excellent adhesion to each interface of a laminate including a plating core pattern, an electrically conductive ultrafine pattern which can be preferably used as a highly accurate electric circuit and a method for manufacturing the same are also provided. The method includes (1) a step of applying a resin composition to form (Continued)

a receiving layer on a substrate; (2) a step of printing an ink containing plating core particles by a reverse offset printing method to form a plating core pattern on the receiving layer; and (3) a step of depositing a metal on the plating core pattern formed in the step (2) by an electrolytic plating method.

5 Claims, 1 Drawing Sheet

(52) U.S. Cl.
CPC ........... *H05K 1/0313* (2013.01); *H05K 1/097* (2013.01); *H05K 3/12* (2013.01); *H05K 2201/0203* (2013.01); *H05K 2201/09218* (2013.01)

(56) References Cited

U.S. PATENT DOCUMENTS

| | | | |
|---|---|---|---|
| 2012/0164400 A1* | 6/2012 | Nagahama | C09D 11/30 428/195.1 |
| 2014/0144684 A1* | 5/2014 | Saitou | H05K 1/095 174/257 |

FOREIGN PATENT DOCUMENTS

| | | | | |
|---|---|---|---|---|
| JP | 06-001940 | * | 1/1994 | ............ C09D 11/10 |
| JP | 2005-286158 A | | 10/2005 | |
| JP | 2009-123791 A | | 6/2009 | |
| WO | 2013/015056 A1 | | 1/2013 | |
| WO | 2013/035582 A1 | | 3/2013 | |

* cited by examiner

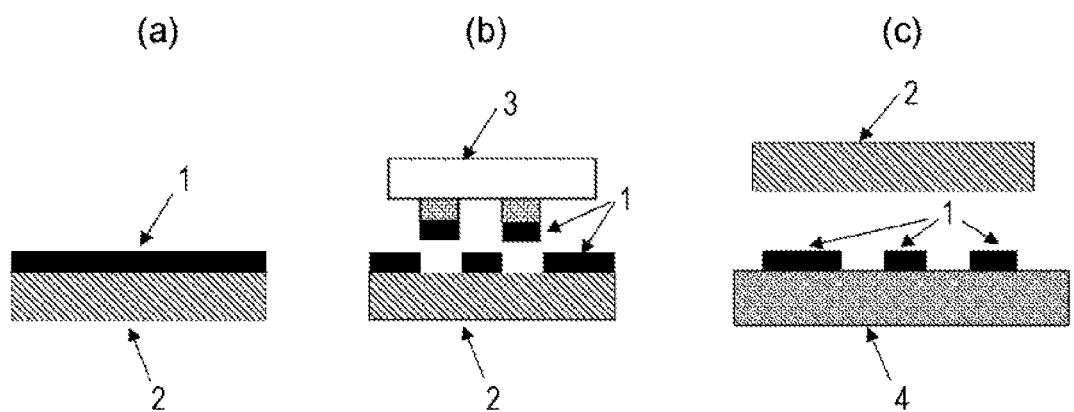

METHOD FOR FORMING ELECTRICALLY CONDUCTIVE ULTRAFINE PATTERN, ELECTRICALLY CONDUCTIVE ULTRAFINE PATTERN, AND ELECTRIC CIRCUIT

TECHNICAL FIELD

The present invention relates to a method for forming an electrically conductive ultrafine pattern, the method including a plating core ink printing process and an electrolytic plating process performed on a plating core pattern; the pattern described above; and an electric circuit including the pattern described above.

BACKGROUND ART

Heretofore, for the formation of an electrically conductive ultrafine pattern, in general, a photolithographic method capable of performing ultrafine patterning has been used. However, in a photolithographic method, steps including metal deposition, resist coating, exposure using a mask, unnecessary resist removal, metal etching, and remaining resist removal are required, and as a result, there have been many problems as described below. For example, a huge equipment investment for large scale facilities is required, and the productivity is not sufficient due to complicated production steps. Furthermore, since the procedure is performed in such a way that after a metal film is once formed on the entire surface, unnecessary portions of the film are then removed, a material cost is increased, and environmental load is also high.

In recent years, in order to overcome the problems of the equipment cost, the material cost, and the productivity of a photolithographic method, the formation of an electrically conductive ultrafine pattern has been attempted by a printing method; however, for example, the electrical conductivity of an electrically conductive pattern formed by a printing method is disadvantageously inferior to that formed by a photolithographic method, and as a result, a practically usable electrically conductive pattern has not been developed yet.

In addition, in order to overcome the problems of the equipment cost, the material cost, and the productivity of a photolithographic method, and the problem of a low electrical conductivity of a printing method, a fusion technique of a printing process and a plating process (such as a technique of forming an electrically conductive pattern in which after an electrically conductive ink containing an electrically conductive substance, such as silver, or a plating core agent is applied on a surface of a support member and then fired to form a plating core pattern, the surface thereof is processed by a plating treatment to form a plating layer on the surface of the plating core pattern) has drawn attention (for example, see PTLs 1, 2, and 3).

Since a cross-sectional shape of the electrically conductive pattern described above reflects a cross-sectional shape of the above plating core pattern, for example, when a plating treatment is performed on a plating core pattern having irregularities, the surface of an electrically conductive pattern obtained thereby has a cross-sectional shape corresponding to the irregularities of the plating core pattern.

For example, when the plating core pattern is formed by screen printing in which undulation is generated by a mesh screen, the undulation is also generated on the surface of the electrically conductive pattern, and as a result, semi-cylindrical or coffer-stain cross-sectional shapes are formed. When the plating core pattern is formed by IJ printing, the electrically conductive pattern also has semi-cylindrical or coffer-stain cross-sectional shapes. In association with this cross-sectional shape, irregular electrical conductivity is generated in the electrically conductive pattern, and/or ignition occurs at a thin film portion of the electrically conductive pattern due to electrolysis concentration thereto in some cases.

In addition, as a laminate including a plating core pattern, although a laminate having excellent adhesion at the respective interfaces among an object on which printing is to be performed, the plating core pattern, and the plating core pattern is desired, a laminate capable of satisfying all of them has not been found yet.

CITATION LIST

Patent Literature

PTL 1: Japanese Unexamined Patent Application Publication No. 60-246695
PTL 2: Japanese Unexamined Patent Application Publication No. 2005-286158
PTL 3: Japanese Unexamined Patent Application Publication No. 2009-123791

SUMMARY OF INVENTION

Technical Problem

In consideration of the above situations, the present invention aims to provide a method for forming an electrically conductive ultrafine pattern having an excellent pattern cross-sectional shape by a composite technique of a printing process and a plating process and also aims to provide an electrically conductive ultrafine pattern which can be preferably used as a highly accurate electric circuit by imparting excellent adhesion to respective interfaces of a laminate including a plating core pattern and a method for manufacturing the same.

Solution to Problem

Through intensive research carried out in consideration of the above situations, the present inventors found that after pattern formation is performed by printing a plating core pattern on a resin layer by a reverse offset printing method, when electrolytic plating is performed on the pattern, an electrically conductive ultrafine pattern can be obtained in which interlayer adhesion of a laminate including the plating core pattern is improved and which has preferable pattern cross-sectional shape and fineness, each of which is comparable to that obtained by a photolithographic method, and as a result, the present invention was finally made.

That is, the present invention provides a method for forming an electrically conductive ultrafine pattern, the method comprising: (1) a step of applying a resin composition (a) to form a receiving layer (A) on a substrate; (2) a step of printing an ink (b) containing particles (b1) to be formed into plating cores by a reverse offset printing method to form a plating core pattern (B) on the receiving layer (A); and (3) a step of depositing a metal on the plating core pattern (B) formed in the step (2) by an electrolytic plating method; an electrically conductive ultrafine pattern obtained by the method described above; and an electric circuit including the electrically conductive ultrafine pattern.

Advantageous Effects of Invention

According to the method of the present invention, by patterning of the plating core ink by reverse offset printing, and metal deposition on the plating core pattern by a plating treatment, an electrically conductive ultrafine pattern having preferable pattern cross-sectional shape and fineness, each of which is comparable to that obtained by a photolithographic method, can be easily obtained at high productivity.

BRIEF DESCRIPTION OF DRAWINGS

FIG. 1 includes views showing a basic process of a reverse offset printing method.

FIG. 2 shows observation results of cross-sectional shapes of electrically conductive patterns measured by an optical interference microscope.

DESCRIPTION OF EMBODIMENTS

Hereinafter, a method for forming an electrically conductive ultrafine pattern of the present invention will be described in detail.

A first step of the present invention is a step of applying a resin composition (a) to form a receiving layer (A) on a substrate. By this step, an ink pattern-receiving member in a subsequent second step by reverse offset printing can be obtained.

The substrate used in the first step is not particularly limited, and for example, an insulating support member or a porous insulating support member may be used, each of which is formed, for example, from a polyimide resin, a poly(amide imide) resin, a polyamide resin, a poly(ethylene terephthalate) resin, a poly(ethylene naphthalate) resin, a polycarbonate resin, an acrylonitrile-butadiene-styrene (ABS) resin, an acrylic resin such as a poly(methyl (meth) acrylate), a poly(vinylidene fluoride) resin, a poly(vinyl chloride) resin, a poly(vinylidene chloride) resin, a poly(vinyl alcohol) resin, a polyethylene resin, a polypropylene resin, a polyurethane resin, a cellulose nanofiber, a silicon, a ceramic, or a glass.

In addition, as the substrate, for example, a substrate formed from a synthetic resin, such as a polyester fiber, a polyamide fiber, or an aramid fiber, or a natural fiber, such as cotton or hemp, may also be used. Those fibers may be processed in advance.

As the substrate, in general, a substrate formed from a polyimide resin, a poly(ethylene terephthalate), a poly(ethylene naphthalate), a glass, a cellulose nanofiber, or the like, which is frequently used as a support member when an electrically conductive pattern of an electric circuit or the like is formed, is preferably used.

As the substrate, a relatively flexible material which can be bent or the like is preferably used since flexibility can be imparted to an electrically conductive pattern, and a bendable final product can be obtained. In particular, a substrate in the form of a film or a sheet which is formed by uniaxial stretching or the like is preferably used.

As the substrate in the form of a film or a sheet, for example, a poly(ethylene terephthalate) film, a polyimide film, a poly(ethylene naphthalate) film, or the like is preferably used.

As the substrate described above, in order to realize the reduction in weight and thickness of an electrically conductive ultrafine pattern to be obtained and a final product, such as an electric circuit, which is obtained using the above pattern, a substrate having a thickness of approximately 1 to 200 μm is preferably used.

In the first step of the present invention, it is required to form the receiving layer (A) by applying the resin composition (a) on the substrate described above. By this receiving layer (A) provided on the substrate, interlayer peeling, for example, between the substrate and a plating core pattern caused by chemical regents or the like which are used in a subsequent step, in particular, in an electrolytic plating step, can be prevented, and hence, a highly reliable electrically conductive pattern can be obtained.

When the surface of a coating film (receiving layer) obtained by applying this resin composition (a) on the substrate comes into contact with an ink containing particles (b1) to be formed into plating cores which will be described later, the coating film absorbs the above medium and carries the particles to be formed into plating cores on the surface thereof.

Subsequently, a laminate structure composed of the plating core pattern and the receiving layer is formed through a heating step and/or the like. Accordingly, an electrically conductive pattern can be obtained which has an excellent adhesion at a level at which no aging peeling occurs at the interface between the plating core pattern and the receiving layer.

<Resin Composition (a)>

The resin composition (a) used in the present invention is not particularly limited as long as having the function described above, and for example, there may be mentioned a natural rubber, an olefinic resin, a polyether such as a poly(ethylene oxide) or a poly(propylene oxide), an unsaturated polyester resin, an acrylic resin, a phenol resin, a melamine resin, a benzoguanamine resin, an epoxy resin, a urethane resin, a vinyl polyester resin, a petroleum resin, a rosin resin, a silicone resin, a vinyl resin, such as a poly(vinyl alcohol), vinyl chloride, vinyl acetate, or a vinyl chloride-vinyl acetate copolymer, a cellulose resin, or a natural polysaccharide. Among those mentioned above, a resin composition containing an urethane resin (a1) having a weight average molecular weight of 5,000 or more or a vinyl resin (a2), and a medium (a3) dissolving or dispersing the above resin is preferably used since the adhesion to the substrate, the adhesion to the particles to be formed into plating cores, and the like are excellent.

As the urethane resin (a1) described above, for example, a urethane resin having a polyether structure, a urethane resin having a polycarbonate structure, and a urethane resin having an aliphatic polyester structure may be mentioned, and as the vinyl resin (a2), an acrylic resin may be mentioned.

The urethane resin (a1) and the vinyl resin (a2) may be used in combination. When those resins are used in combination, the urethane resin (a1) and the vinyl resin (a2) are preferably contained in a range of [(a1)/(a2)]=90/10 to 10/90 and are preferably used in a range of 70/30 to 10/90. In addition, composite resin particles each composed of a shell layer formed from the urethane resin (a1) and a core layer formed from the vinyl resin (a2) are preferably contained since the adhesion and the like are further improved.

A composition (a) in which the total mass of the urethane resin (a1) and the vinyl resin (a2) is in a range of 10 to 70 percent by mass is preferably used since an easy coating property and the like can be maintained, and a composition containing 10 to 50 percent by mass thereof is more preferably used.

In addition, as the medium (a3), various types of organic solvents and aqueous media may be used.

As the organic solvents, for example, toluene, ethyl acetate, and methyl ethyl ketone may be used. In addition, as the aqueous media, water, an organic solvent miscible with water, and a mixture thereof may be mentioned.

As the organic solvent miscible with water, for example, there may be mentioned an alcohol, such as methanol, ethanol, n-propanol, isopropanol, ethyl carbitol, ethyl cellosolve, or butyl cellosolve; a ketone, such as acetone or methyl ethyl ketone; a poly(alkylene glycol), such as ethylene glycol, diethylene glycol, or propylene glycol; an alkyl ether of a poly(alkylene glycol); or a lactam such as N-methyl-2-pyrrolidone.

As the medium (a3) used in the present invention, water may only be used, water and an organic solvent miscible with water may be used, or an organic solvent miscible with water may only be used. In consideration of safety and environmental load, only water or a mixture of water and an organic solvent miscible with water is preferably used, and only water is particularly preferably used.

When an aqueous medium is used as the medium (a3), a resin having a hydrophilic group is preferably used for the urethane resin (a1) or the vinyl resin (a2) since the water dispersibility and the storage stability of the composition (a) can be improved.

As the hydrophilic group described above, for example, an anionic group, a cationic group, and a nonionic group may be mentioned, and an anionic group is particularly preferable.

As the anionic group, for example, a carboxyl group, a carboxylate group, a sulfonic acid group, or a sulfonate group may be used, and among those mentioned above, a carboxylate group or a sulfonate group, each of which is partially or entirely neutralized by a basic compound, is preferably used since good water dispersibility can be imparted to the resin.

As a basic compound usable for neutralization of the anionic group, for example, ammonia; an organic amine, such as triethylamine, pyridine, or morpholine; an alkanolamine such as monoethanolamine; or a metal base compound of sodium, potassium, lithium, calcium, or the like may be mentioned. When the plating core pattern is formed, since the above metal salt compound may disturb a plating deposition property in some cases, as the base compound, the aforementioned ammonia, organic amine, or alkanol amine is preferably used.

When the aforementioned carboxylate group or sulfonate group is used as the anionic group, the above group is preferably present in a range of 50 to 2,000 mmol/kg with respect to the total resin since preferable water dispersibility can be imparted to the resin.

In addition, as the cationic group, for example, a tertiary amino group may be used.

As an acid which can be used when the aforementioned tertiary amino group is partially or entirely neutralized, for example, there may be used an organic acid, such as acetic acid, propionic acid, lactic acid, or maleic acid: a sulfonic acid, such as sulfonic acid or methanesulfonic acid; or an inorganic acid, such as a hydrochloric acid, a sulfuric acid, orthophosphoric acid, or orthophosphorous acid. When the plating core pattern or the like is formed, for example, since chlorine or sulfur may disturb the plating deposition property and the like in some cases, acetic acid, propionic acid, lactic acid, maleic acid, or the like is preferably used.

In addition, as the nonionic group, for example, a poly(oxyalkeylene) group, such as a polyoxyethylene group, a polyoxypropylene group, a polyoxybutylene group, a poly(oxyethylene-oxypropylene) group, or a polyoxyethylene-polyoxyalkylene group, may be used. In particular, a polyoxyalkylene group having an oxyethylene unit is preferably used in order to further improve the hydrophilic property.

As the urethane resin (a1), a urethane resin obtained by a reaction between a polyol and a polyisocyanate together with a chain extender, if needed, may be used. In particular, in order to further improve the adhesion, a urethane resin having a polyether structure, a urethane resin having a polycarbonate structure, or a urethane resin having an aliphatic polyester structure is preferably used.

The above polyether structure, polycarbonate structure, and aliphatic polyester structure are each preferably a structure derived from a polyol used for manufacturing the urethane resin described above. In particular, a urethane resin having the polyether structure preferably uses as a polyol to be used for manufacturing thereof, a compound containing a polyether polyol which will be described later. In addition, a urethane resin having the polycarbonate structure preferably uses as the polyol described above, a compound containing a polycarbonate polyol which will be described later. In addition, a urethane resin having the aliphatic polyester structure preferably uses as the polyol described above, a compound containing an aliphatic polyester polyol which will be described later.

As a polyol usable for manufacturing the urethane resin (a1), as described above, for example, a polyether polyol, a polycarbonate polyol, and an aliphatic polyester polyol may be used. In addition, as the polyol, if needed, at least one another polyol may also be used in combination.

As the polyether polyol, for example, there may be used a polyol obtained by addition polymerization of an alkylene oxide using at least one type of compound having at least two active hydrogen atoms as an initiator.

As the initiator, for example, ethylene glycol, diethylene glycol, triethylene glycol, propylene glycol, trimethylene glycol, 1,3-butanediol, 1,4-butanediol, 1,6-hexanediol, neopentyl glycol, glycerin, trimethylolethane, or trimethylolpropane may be used.

As the alkylene oxide, for example, ethylene oxide, propylene oxide, butylene oxide, styrene oxide, epichlorohydrin, or tetrahydrofuran may be used.

As the polycarbonate polyol, for example, a compound obtained by a reaction between a carbonate ester and a polyol or a compound obtained by a reaction between phosgene and bisphenol A or the like may be used.

As the carbonate ester, for example, methyl carbonate, dimethyl carbonate, ethyl carbonate, diethyl carbonate, a cyclocarbonate, or diphenyl carbonate may be used.

As a polyol reactable with the carbonate ester, for example, there may be used a dihydroxy compound having a relatively low molecular weight, such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, 1,11-undecanediol, 1,12-dodecanediol, 3-methyl-1,5-pentanediol, 2-ethyl-1,3-hexanediol, 2-methyl-1,3-propanediol, 2-methyl-1,8-octanediol, 2-butyl-2-ethylpropanediol, neopentyl glycol, hydroquinone, resorcin, bisphenol-A, bisphenol-F, or 4,4'-biphenol.

In addition, as the aliphatic polyester polyol, for example, there may be used an aliphatic polyester polyol obtained by an esterification reaction between a low molecular weight polyol and a poly(carboxyl acid); an aliphatic polyester obtained by a ring-opening polymerization reaction of a cyclic ester compound, such as ε-caprolactone or γ-butyrolactone; and a copolymer polyester thereof.

As a low molecular weight polyol usable for manufacturing the polyester polyol, for example, ethylene glycol, 1,2-propanediol, 1,3-butanediol, 1,4-butanediol, 1,6-hexanediol, 3-methyl-1,5-pentanediol, neopentyl glycol, diethylene glycol, dipropylene glycol, glycerin, trimethylolpropane, and 1,4-cyclohexanedimethanol may be used alone, at least two types thereof may be used in combination. In particular, ethylene glycol, 1,2-propanediol, 1,3-butanediol, or 1,4-butanediol is preferably used in combination with 3-methyl-1,5-pentanediol or neopentyl glycol.

As the poly(carboxylic acid), for example, succinic acid, adipic acid, sebacic acid, dodecane dicarboxylic acid, azelaic acid, or an anhydride or an ester thereof may be used, and an aliphatic poly(carboxylic acid) such as adipic acid is preferably used.

As the polyether polyol, the polycarbonate polyol, and the aliphatic polyester polyol, a compound having a number average molecular weight of 500 to 4,000 is preferably used, and a compound having a number average molecular weight of 500 to 2,000 is more preferably used.

In addition, as a polyol usable for manufacturing the urethane resin (a1), besides the compounds mentioned above, if needed, another polyol may also be used together therewith.

As the another polyol, for example, ethylene glycol, 1,2-propanediol, 1,3-butanediol, 1,4-butanediol, 3-methyl-1,5-pentanediol, 1,6-hexanediol, 1,4-cyclohexanedimethanol, neopentyl glycol, diethylene glycol, dipropylene glycol, glycerin, trimethylolpropane, an acrylic polyol obtained by incorporating a hydroxyl group into an acrylic copolymer, a polybutadiene polyol, a hydrogenated polybutadiene polyol, or a partially saponified ethylene-vinyl acetate copolymer may be appropriately used.

In addition, when a urethane resin having a hydrophilic group is manufactured as the urethane resin (a1), as the another polyol, a polyol having a hydrophilic group is preferably used.

As the polyol having a hydrophilic group, for example, there may be used a polyol having a carboxyl group, such as 2,2-dimethylolpropionic acid, 2,2-dimethylolbutanoic acid, or 2,2-dimethylolvaleric acid; or a polyol having a sulfonic acid group, such as 5-sulfoisophthalic acid, sulfoterephthalic acid, 4-sulfophthalic acid, or 5[4-sulfophenoxy]isophthalic acid. In addition, as the polyol having a hydrophilic group, there may also be used a polyester polyol having a hydrophilic group which is obtained by a reaction between the aforementioned low molecular weight polyol having a hydrophilic group and at least one of various poly(carboxylic acid)s, such as adipic acid.

The polyol having a hydrophilic group described above is preferably used in a range of 0.1 to 10 percent by mass with respect to the total mass of a polyol to be used for manufacturing of the urethane resin (a1).

As a polyisocyanate usable for a reaction with the polyol described above, for example, there may be used a polyisocyanate having an aromatic structure, such as 4,4'-diphenylmethane diisocyanate, 2,4'-diphenylmethane diisocyanate, carbodiimide-modified diphenylmethane diisocyanate, a crude diphenylmethane diisocyanate, phenylene diisocyanate, tolylene diisocyanate, or naphthalene diisocyanate; or an aliphatic polyisocyanate or a polyisocyanate having an aliphatic cyclic structure, such as hexamethylene diisocyanate, lysine diisocyanate, cyclohexane diisocyanate, isophorone diisocyanate, dicyclohexylmethane diisocyanate, xylylene diisocyanate, or tetramethylxylylene diisocyanate. In particular, a polyisocyanate having an aliphatic cyclic structure is preferably used.

In addition, as a chain extender usable when the urethane resin is manufactured, a polyamine, a hydrazine compound, or other compounds having an active hydrogen atom may be used.

As the polyamine, for example, there may be used a diamine, such as ethylenediamine, 1,2-propanediamine, 1,6-hexamethylenediamine, piperazine, 2,5-dimethylpiperazine, isophoronediamine, 4,4'-dicyclohexylmethanediamine, 3,3'-dimethyl-4,4'-dicyclohexylmethanediamine, or 1,4-cyclohexanediamine; N-hydroxymethylaminoethylamine, N-hydroxyethylaminoethylamine, N-hydroxypropylaminopropylamine, N-ethylaminoethylamine, N-methylaminopropylamine, diethylenetriamine, dipropylenetriamine, or triethylenetetramine, and ethylenediamine is preferably used.

As the hydrazine compound, for example, there may be used hydrazine, N,N'-dimethylhydrazine, 1,6-hexamethylene-bishydrazine, succinic acid dihydrazide, adipic acid dihydrazide, glutaric acid dihydrazide, sebacic acid dihydrazide, isophthalic acid dihydrazide, β-semicarbazide propionic acid hydrazide, 3-semicarbazide-propyl-carbazate, or semicarbazide-3-semicarbazidemethyl-3,5,5-trimethylcyclohexane.

As the above other compounds having an active hydrogen, for example, there may be used a glycol, such as ethylene glycol, diethylene lycol, triethylene glycol, propylene glycol, 1,3-propanediol, 1,3-butanediol, 1,4-butanediol, hexamethylene glycol, saccharose, methylene glycol, glycerin, or sorbitol; a phenol, such as bisphenol A, 4,4'-dihydroxydiphenyl, 4,4'-dihydroxydiphenyl ether, 4,4'-dihydroxydiphenyl sulfone, hydrogenated bisphenol A, or hydroquinone; or water.

The chain extender is preferably used in a range in which the equivalent ratio of the amino group of the polyamine to the isocyanate group is 1.9 or less (equivalent ratio) and more preferably used in a range of 0.3 to 1 (equivalent ratio).

In accordance with a known method, the urethane resin (a1) can be manufactured, for example, in the presence or absence of an organic solvent, by a reaction between the polyol and the polyisocyanate together with the above chain extender if needed.

The reaction between the polyol and the polyisocyanate may be performed by a method in such a way that in sufficient consideration of safety so as not cause rapid heat generation, bubbling, and the like, at a reaction temperature of preferably 50° C. to 120° C. or more preferably 80° C. to 100° C., the polyol and the polyisocyanate are collectively mixed together, or one of them is successively supplied to the other by dripping or the like, and the reaction is performed for approximately 1 to 15 hours.

An aqueous dispersion of the urethane resin (a1) can be manufactured in such a way that after the urethane resin (a1) is manufactured by a reaction between the polyol and the polyisocyanate using the method described above together with a chain extender if needed, and the hydrophilic group, such as an anionic group, of the urethane resin (a1) is, for example, partially or entirely neutralized if needed, the urethane resin (a1) thus obtained is mixed with an aqueous medium to be used as a solvent of the composition (a).

In more particular, after a urethane prepolymer having an isocyanate group at the terminal is manufactured by a reaction between the polyol and the polyisocyanate in accordance with the method described above, and if needed, the hydrophilic group, such as an anionic group, of the above urethane prepolymer is partially or entirely neutralized, the urethane prepolymer thus obtained is mixed with the above aqueous medium and, if needed, is chain extended using the chain extender described above, so that a urethane resin aqueous dispersion usable as the composition (a) in which the urethane resin (a1) is dispersed or dissolved in the aqueous medium can be manufactured.

The reaction between the polyol and the polyisocyanate is preferably performed so that, for example, the equivalent ratio [isocyanate group/hydroxyl group] of the isocyanate group of the polyisocyanate to the hydroxyl group of the polyol is in a range of 0.9 to 2.

When the urethane resin (a1) is manufactured, as the solvent, an organic solvent may also be used.

As the organic solvent, for example, a ketone, such as acetone or methyl ethyl ketone; an ether, such as tetrahydrofuran or dioxane; an acetic acid ester, such as ethyl acetate or butyl acetate; a nitrile such as acetonitrile; an amide, such as dimethylformamide or N-methylpyrrolidone, may be used alone, or at least two types thereof may be used in combination.

After the urethane resin (a1) is manufactured, the organic solvent is preferably removed by a distillation method or the like. However, when a composition containing the urethane resin (a1) and an organic solvent is used as the composition (a), the organic solvent used for manufacturing of the urethane resin (a1) may also be used as a solvent of the composition (a).

In order to form the plating core pattern excellent in adhesion, the urethane resin (a1) preferably has a weight average molecular weight of 5,000 to 500,000, and a urethane resin having a weight average molecular weight of 20,000 to 100,000 is more preferably used.

When the urethane resin (a1) incorporates a functional group having reactivity with an organic compound used as a protective agent for particles contained in the ink (b) to be formed into plating cores which will be described later, the interlayer adhesion between the receiving layer (A) and the plating core pattern (B) can be further improved. Hence, the functional group to be incorporated into the urethane resin (a1) is selected in accordance with the functional group of the protective agent contained in an ink to be used, and as a general method for incorporating a reactive functional group, there may be mentioned a method in which as a polyol usable for manufacturing of the urethane resin (a1), a polyol having the functional group as described above is used. For example, when a keto group is incorporated as the functional group, a method in which as the polyol, a polyol having a keto group is used may be mentioned.

In addition, when an epoxy group is incorporated as the functional group, a method in which as a polyol to be used when the urethane resin (a1) is manufactured, a polyol having an epoxy group is used may be mentioned.

In addition, when a carboxylic acid group is incorporated as the functional group, a method in which as a polyol to be used when the urethane resin (a1) is manufactured, a polyol having a carboxyl group is used may be mentioned.

In addition, in the case in which an isocyanate group or a blocked isocyanate group is incorporated as the functional group, when the urethane resin (a1) is manufactured, for example, by a reaction between the polyol and the polyisocyanate, a method may be mentioned in which the reaction is controlled so that the isocyanate group partially remains, or a method may be mentioned in which the isocyanate group is blocked by a blocking agent, such as methyl ethyl ketone oxime.

The urethane resin (a1) preferably has a functional group cross-linkable with a reactive functional group in the protective agent contained in the ink (b) in a range of 50 to 5,000 mmol/kg with respect to the total of the urethane resin (a1).

In addition, besides the functional group described above, the urethane resin (a1) may also have a cross-linkable functional group, such as an alkoxysilyl group, a silanol group, a hydroxyl group, and/or an amino group.

Since forming a cross-linked structure in the receiving layer (A) which carries the plating core ink, the cross-linkable functional group is preferably used to form a plating core pattern having excellent durability.

The alkoxysilyl group and the silanol group can be incorporated into the urethane resin (a1) by using γ-aminopropyltrimethoxysilane or the like when the urethane resin (a1) is manufactured.

In addition, when an electrolytic plating treatment which will be described later is performed, in order to obtain excellent durability that can prevent peeling of a primer resin layer and the plating core pattern from a support member caused by the influence of a plating chemical agent which is composed of a strong alkali or a strong acid substance and which is used in a plating treatment step, as the urethane resin (a1), a urethane resin having an aliphatic cyclic structure is preferably used.

As the aliphatic cyclic structure, for example, a cyclobutyl group, a cyclopentyl group, a cyclohexyl group, a cycloheptyl group, a cyclooctyl group, a propylcyclohexyl group, a tricyclo[5,2,1,0,2,6]decyl group, a bicyclo[4,3,0]-nonyl group, a tricyclo[5,3,1,1]dodecyl group, a propyltricyclo[5,3,1,1]dodecyl group, a norbornene group, an isobornyl group, a dicyclopentanyl group, or an adamantyl group may be mentioned. Among those mentioned above, a cyclohexyl group, a norbornene group, an isobornyl group, or an adamantyl group is preferably used since a plating core pattern excellent in durability can be obtained.

As a polyisocyanate and a polyol used for manufacturing of the urethane resin (a1), when a polyisocyanate having an aliphatic cyclic structure and a polyol having an aliphatic cyclic structure are used, the aliphatic cyclic structure as described above can be incorporated into the urethane resin (a1). In particular, a urethane resin having an aliphatic cyclic structure derived from a polyol having an aliphatic cyclic structure is preferably used, and a urethane resin having an aliphatic cyclic structure derived from a polyisocyanate having an aliphatic cyclic structure and a polyol having an aliphatic cyclic structure is particularly preferably used since the adhesion of the receiving layer (A) to each of the various substrates described above is significantly improved. In addition, the aliphatic cyclic structure is preferably contained in the urethane resin in a range of 2,000 to 5,500 mmol/kg with respect to the total mass of the urethane resin (a1), and a compound containing an aliphatic cyclic structure in a range of 3,000 to 5,000 mmol/kg is more preferably used since the adhesion of the resin to the substrate is improved, and in particular, in the plating treatment step, since the receiving layer is prevented from being peeled away from the substrate, and the durability is improved.

As the vinyl resin (a2) contained in the composition (a), a polymer formed from a monomer having a polymerizable unsaturated double bond may be used. In particular, for example, a polyethylene, a polypropylene, a polybutadiene, an ethylene-propylene copolymer, a natural rubber, a synthetic isopropylene rubber, an ethylene-vinyl acetate copolymer, or an acrylic resin may be used. Among those mentioned above, when the particles (b1) to be formed into plating cores are protected by an organic compound as described above, an acrylic resin is preferably used since a functional group cross-linkable with the above organic compound can be easily incorporated therein.

As the acrylic resin, a polymer or a copolymer obtained by polymerizing a (meth)acrylic monomer may be used. In addition, the (meth)acrylic monomer represents at least one of an acrylic monomer and a methacrylic monomer. In addition, a (meth)acrylic acid represents at least one of acrylic acid and methacrylic acid, and a (meth)acrylate represents at least one of an acrylate and a methacrylate.

As the (meth)acrylic monomer mentioned above, for example, there may be used a (meth)acrylic acid ester, such as methyl (meth)acrylate, ethyl (meth)acrylate, n-butyl (meth)acrylate, i-butyl (meth)acrylate, t-butyl (meth)acrylate, 2-ethylhexyl (meth)acrylate, hexyl (meth)acrylate, cyclohexyl (meth)acrylate, octyl (meth)acrylate, nonyl (meth)acrylate, dodecyl (meth)acrylate, stearyl (meth)acrylate, isobornyl (meth)acrylate, norbornyl (meth)acrylate, tricyclodecanyl (meth)acrylate, adamantyl (meth)acrylate, dicyclopentanyl (meth)acrylate, phenyl (meth)acrylate, or benzyl (meth)acrylate; an acrylic acid alkyl ester, such as 2,2,2-trifluoroethyl (meth)acrylate, 2,2,3,3-pentafluoropropyl (meth)acrylate, perfluorocyclohexyl (meth)acrylate, 2,2,3,3,-tetrafluoropropyl (meth)acrylate, β-(perfluorohexylethyl) (meth)acrylate, a (poly)ethylene glycol di(meth) acrylate, a (poly)propylene glycol di(meth)acrylate, a (poly) butylene glycol di(meth)acrylate, a (poly)neopentyl glycol di(meth)acrylate, or N,N'-methylene bis(meth)acrylamide; or tricyclodecanedimethanol diacrylate.

Among those mentioned above, since the adhesion of the receiving layer (A) to be obtained to the substrate and to the plating core pattern is more excellent, a compound is preferably used which is obtained by polymerization of a vinyl monomer mixture containing 10 to 70 percent by mass of methyl methacrylate and 10 to 50 percent by mass of an alkyl (meth)acrylate having an alkyl group with 2 to 12 carbon atoms.

As a method for incorporating a functional group into the vinyl resin (a2), the functional group being capable of forming a bond by a reaction with an organic compound used as the protective agent for the particles (b1) to be formed into plating cores which will be described later, a method may be mentioned in which as the monomer having a polymerizable unsaturated double bond, a monomer having a functional group is used. For example, when a keto group is incorporated as the functional group, a method in which a monomer having a keto group, such as diacetone acrylamide, is used may be mentioned.

In addition, when an acetoacetoxy group is incorporated as the functional group, for example, a method in which 2-acetoacetoxyethyl (meth)acrylate is used may be mentioned.

In addition, when an epoxy group is incorporated as the functional group, for example, a method in which glycidyl (meth)acrylate or allyl glycidyl (meth)acrylate is used may be mentioned.

In addition, when an acid group or an anhydride group is incorporated as the functional group, for example, there may be mentioned a method which uses a monomer having a carboxyl group or an anhydride thereof, such as acrylic acid, methacrylic acid, β-carboxyethyl (meth)acrylate, 2-(meth) acryloylpropionic acid, crotonic acid, itaconic acid, maleic acid, fumaric acid, an itaconic acid half ester, a maleic acid half ester, maleic anhydride, itaconic anhydride, citraconic anhydride, β-(meth)acryloyloxyethyl hydrogen succinate, citraconic acid, a citraconic acid half ester, or citraconic anhydride.

In addition, when an isocyanate group or a blocked isocyanate group is incorporated as the functional group, for example, a method may be mentioned which uses a monomer having an isocyanate group or a blocked compound thereof, such as (meth)acryloyl isocyanate, (meth)acryloyl isocyanate ethyl, or a phenol or a methyl ethyl ketoxime adduct thereof.

In addition, when an N-alkylol group is incorporated as the functional group, a method may be mentioned which uses N-methylol (meth)acrylamide, N-methoxymethyl (meth)acrylamide, N-ethoxymethyl (meth)acrylamide, N-propoxymethyl (meth)acrylamide, N-isopropoxymethyl (meth)acrylamide, N-n-butoxymethyl (meth)acrylamide, N-isobutoxymethyl (meth)acrylamide, N-pentoxymethyl methyl (meth)acrylamide, N-ethanol acrylamide, N-propanol acrylamide, or the like.

In addition, as the acrylic resin, if needed, a resin having a cross-linkable functional group, such as an amide group, a hydroxyl group, an amino group, a silyl group, an aziridinyl group, an oxazoline group, or a cyclopentenyl group, may also be used.

As a monomer usable when the cross-linkable functional group is incorporated into the vinyl resin (a2), such as an acrylic resin, for example, there may be used (meth)acrylamide; a vinyl monomer having a hydroxyl group, such as 2-hydroxyethyl (meth)acrylate, 2-hydroxypropyl (meth) acrylate, 2-hydroxybutyl (meth)acrylate, 4-hydroxybutyl (meth)acrylate, 6-hydroxyhexyl (meth)acrylate, (4-hydroxymethylcyclohexyl)methyl (meth)acrylate, glycerol (meth)acrylate, a poly(ethylene glycol) (meth)acrylate, or N-hydroxyethyl (meth)acrylamide: a vinyl monomer having an amino group, such as aminoethyl (meth)acrylate, dimethylaminoethyl (meth)acrylate, a N-monoalkylaminoalkyl (meth)acrylate, or a N,N-dialkylaminoalkyl (meth)acrylate; a polymerizable monomer having a silyl group, such as vinyltrichlorosilane, vinyltrimethoxysilane, vinyltriethoxysilane, vinyltris(β-methoxyethoxy)silane, γ-(meth)acryloxypropyltrimethoxysilane, γ-(meth)acryloxypropyltriethoxysilane, γ-(meth)acryloxypropylmethyldimethoxysilane, γ-(meth)acryloxypropylmethyldiethoxysilane, γ-(meth)acryloxypropyltriisopropoxysilane, N-β-(N-vinylbenzylaminoethyl)-γ-aminopropyltrimethoxysilane, or a hydrochloride salt thereof; a polymerizable monomer having an aziridinyl group, such as 2-aziridinylethyl (meth) acrylate; a polymerizable monomer having an oxazoline group, such as 2-isopropenyl-2-oxazoline or 2-vinyl-2-oxazoline; a polymerizable monomer having a cyclopentenyl group, such as dicyclopentenyl (meth)acrylate; or a polymerizable monomer having a carbonyl group, such as acrolein or diacetone (meth)acrylamide.

In addition, when the vinyl resin (a2) is manufactured, the following material or a salt thereof may also be used together with the (meth)acrylic monomer and the like. For example, there may be mentioned vinyl acetate, vinyl propionate, vinyl butyrate, vinyl versatate, methyl vinyl ether, ethyl vinyl ether, propyl vinyl ether, butyl vinyl ether, amyl vinyl ether, hexyl vinyl ether, (meth)acrylonitrile, styrene, α-methylstyrene, vinyltoluene, vinylanisole, α-halostyrene, vinylnaphthalene, divinylstyrene, isoprene, chloroprene, butadiene, ethylene, tetrafluoroethylene, vinylidene fluoride, N-vinylpyrrolidone, poly(ethylene glycol) mono(meth)acrylate, glycerol mono(meth)acrylate, vinyl sulfonic acid, styrene sulfonic acid, allyl sulfonic acid, 2-methylallyl sulfonic acid, 2-sulfoethyl (meth)acrylate, 2-sulfopropyl (meth)acrylate, or "ADEKAREA SOAP PP-70, PPE-710" (manufactured by ADEKA Corp.)".

Although the vinyl resin (a2), such as an acrylic resin, can be manufactured by polymerization of the mixture of monomers having a polymerizable unsaturated double bond in accordance with a known method, in order to manufacture a plating core pattern having excellent adhesion, an emulsion polymerization is preferably used.

As the emulsion polymerization, for example, there may be used a method in which water, a mixture of monomers having a polymerizable unsaturated double bond, a polymerization initiator are collectively charged in a reaction container together with, if needed, a chain transfer agent, an emulsifier, a dispersion stabilizer, and/or the like, and are then mixed and polymerized; a monomer dripping method in which polymerization is performed by dripping a mixture of monomers having a polymerizable unsaturated double bond in a reaction container; and a pre-emulsion method in which after water is mixed in advance with a mixture of monomers having a polymerizable unsaturated double bond, an emulsifier, and the like, polymerization is performed by dripping the mixture prepared as described above in a reaction container.

Although a reaction temperature of the emulsion polymerization method is determined depending on the types of polymerization initiator and monomers having a polymerizable unsaturated double bond, such as a (meth)acrylic monomer, which are to be used for polymerization, for example, a temperature of approximately 30° C. to 90° C. and a time of approximately 1 to 10 hours are preferable.

As the polymerization initiator, for example, a persulfate, such as potassium persulfate, sodium persulfate, or ammonium persulfate; a peroxide, such as benzoyl peroxide, cumene hydroperoxide, or t-butyl hydroperoxide; or hydrogen peroxide may be used. Although radical polymerization may be performed only using the peroxide mentioned above, the above peroxide may be used together with a metal salt of ascorbic acid, erythorbic acid, sodium erythorbate, or formaldehyde sulfoxylate, and/or a reducing agent, such as sodium thiosulfate, sodium bisulfite, or ferric chloride. In addition, as the polymerization initiator mentioned above, an azo initiator, such as 4,4'-azobis(4-cyano valeric acid) or 2,2'-azobis(2-amidinopropane)dihydrochloride, may also be used.

As an emulsifier usable for manufacturing of the vinyl resin (a2), such as an acrylic resin, for example, an anionic surfactant, a nonionic surfactant, a cationic surfactant, or an amphoteric surfactant may be mentioned.

As the anionic surfactant, for example, a sulfuric ester of a higher alcohol and a salt thereof, an alkyl benzene sulfonate, a polyoxyethylene alkylphenyl sulfonate, a polyoxyethylene alkyldiphenyl ether sulfonate, a sulfuric acid half ester salt of a polyoxyethylene alkyl ether, an alkyl diphenyl ether disulfonate, or a succinic acid dialkylester sulfonate, and in particular, "LATEMUL E-118B" (sodium sulfate of a polyoxyethylene alkyl ether manufactured by Kao Corp.) may be used. As the nonionic surfactant, for example, a polyoxyethylene alkyl ether, a polyoxyethylene alkylphenyl ether, a polyoxyethylene diphenyl ether, a polyoxyethylene-polyoxypropylene block copolymer, or an acetylenic diol surfactant may be used.

As the cationic surfactant, for example, an alkyl ammonium salt may be used. As the amphoteric surfactant, for example, an alkyl(amide)betaine or an alkyldimethylamine oxide may be used.

As the emulsifier, besides the surfactants described above, a fluorinated surfactant, a silicone surfactant, or an emulsifier having an intramolecular polymerizable unsaturated group, which is generally called a "reactive emulsifier", may also be used.

As the reactive emulsifier, for example, there may be used "LATEMUL S-180" (manufactured by Kao Corp., reactive surfactant having a sulfonic acid group and a salt thereof), "ELEMINOL JS-2, RS-30" (manufactured by Sanyo Chemical Industries, Co., Ltd.), "Aqualon HS-10, HS-20, KH-1025" (manufactured by Dai-ichi Kogyo Seiyaku Co., Ltd., reactive surfactant having a sulfuric acid group or a salt thereof), "ADEKAREA SOAP SE-10, SE-20" (manufactured by ADEKA Corp.); "New Frontier A-229E" (manufactured by Dai-ichi Kogyo Seiyaku Co., Ltd., reactive surfactant having a phosphoric acid group); and "Aqualon RN-10, RN-20, RN-30, RN-50 (manufactured by Dai-ichi Kogyo Seiyaku Co., Ltd., reactive surfactant having a nonionic hydrophilic group).

As a chain transfer agent usable for manufacturing of the vinyl resin (a2), such as an acrylic resin, for example, lauryl mercaptan may be used, and with respect to the total mass of a mixture of monomers having a polymerizable unsaturated double bond and including the above (meth)acrylic monomer, the chain transfer agent is used preferably in a range of 0 to 1 percent by mass and more preferably in a range of 0 to 0.5 percent by mass.

As the resin in the composition (a), when the vinyl resin (a2) is used without using the urethane resin (a1), a dispersion obtained by dispersing a vinyl resin having a weight average molecular weight of 100,000 or more and an acid value of 10 to 80 in an aqueous medium is preferably used, and although at least one component (z) selected from the group consisting of a water-soluble resin and a filler may also be contained if needed, the composition is preferably prepared so that the content of the component (z) is set in a range of 0 to 15 percent by mass with respect to the total mass of the vinyl resin (a2).

In order to obtain more excellent moisture and heat resistance, the acid value described above is preferably in a range of 10 to 75, more preferably in a range of 15 to 70, even more preferably in a range of 25 to 70, and particularly preferably in a range of 35 to 70.

Although the upper limit of the weight average molecular weight of a vinyl resin which is used for adjustment by the method as described above is not particularly limited, the upper limit is preferably approximately 10,000,000 or less, and in order to ensure the printability of the ink (b) which will be described later, the upper limit is preferably approximately 5,000,000 or less.

Measurement of the weight average molecular weight of a vinyl resin can be generally performed by a gel permeation chromatographic method (GPC method) using a test sample prepared by stirring a mixture of 80 mg of the vinyl resin and 20 ml of tetrahydrofuran for 12 hours. A high speed liquid chromatograph HLC-8220 manufactured by Toso Corp. may be used as a measurement apparatus, four TSKgel GMH XL columns manufactured by Toso Corp. may be used as the columns, tetrahydrofuran may be used as an eluent, and an RI detector may be used as a detector.

However, when the molecular weight of the vinyl resin is more than approximately 1,000,000, it may be difficult in some cases to measure the molecular weight of the vinyl resin by a general molecular weight measurement method using the GPC method or the like.

In particular, even if 80 mg of a vinyl resin having a weight average molecular weight of more than 1,000,000 is mixed with 20 ml of tetrahydrofuran for 12 hours, the vinyl resin is not thoroughly dissolved therein, and when the mixture thus obtained is filtrated using a 1-µm membrane filter, a residue of the vinyl resin may be confirmed on the membrane filter in some cases.

Since the residue as described above is derived from a vinyl resin having a molecular weight of approximately more than 1,000,000, even if the molecular weight is measured by the above GPC method using a filtrate obtained by the filtration described above, a proper weight average molecular weight is difficult to measure in some cases.

Accordingly, in the present invention, when a residue is confirmed on the membrane filter after the filtration, the vinyl resin was regarded as a resin having a weight average molecular weight of more than 1,000,000.

In addition, although being dispersible in an aqueous medium, the vinyl resin may also be partially dissolved therein.

The vinyl resin having an acid group can be easily obtained when a vinyl monomer having an acid group is used in a range of 0.2 to 15 percent by mass with respect to the total mass of a vinyl monomer mixture, and the vinyl monomer is used preferably in a range of 1.5 to 12 percent by mass, more preferably in a range of 3.5 to 11 percent by mass, and further preferably in a range of 5 to 11 percent by mass. When a predetermined amount of a vinyl monomer having an acid group is used, preferable aqueous dispersion stability and moisture and heat resistance can be imparted to a vinyl resin to be obtained.

In addition, when a vinyl monomer having an acid group, in particular, when the vinyl monomer having a carboxyl group, is used in combination with a vinyl monomer having an amide group, with respect to the total mass of a vinyl monomer mixture used for manufacturing of the vinyl resin, the mass rate of the total of the vinyl monomer having an acid group and the vinyl monomer having an amide group is preferably set in a range of more than 5 to 40 percent by mass and more preferably in a range of 6 to 35 percent by mass.

In addition, as the composition (a), a dispersion in which composite resin particles formed of the urethane resin (a1) and the vinyl resin (a2) are dispersed in an aqueous medium may be used.

As the composite resin particle, in particular, a particle may be mentioned in which the vinyl resin (a2) is partially or entirely enclosed in a resin particle formed from the urethane resin (a1). As the composite resin particle, a core-shell type composite resin particle formed from the vinyl resin as a core layer and the urethane resin having a hydrophilic group as a shell layer is preferable. In particular, when the plating core pattern is formed, the core-shell type composite resin particles are preferably used since a surfactant that degrades a plating deposition property is not required to be used.

In addition, as the composite resin particle, when the vinyl resin (a2) has a high hydrophilic property as compared to that of the urethane resin (a1), a composite resin particle in which the urethane resin (a1) is partially or entirely enclosed in a resin particle formed of the vinyl resin (a2) may also be formed.

In addition, although the urethane resin (a1) and the vinyl resin (a2) may form a covalent bond, no bond is preferably formed therebetween.

In addition, as the core-shell type composite resin particle, a urethane-acryl composite resin in which an acrylic resin functions as the vinyl resin (a2) is preferably used.

In addition, in order to maintain a preferable aqueous dispersion property, the average particle diameter of the composite resin particles is preferably in a range of 5 to 100 nm. Although described in the following example, the average particle diameter in this case indicates the average particle diameter on the volume basis measured by a dynamic light scattering method.

As the composite resin particle, the urethane resin (a1) and the vinyl resin (a2) are preferably contained so that [urethane resin (a1)/vinyl resin (a2)] is in a range of 90/10 to 10/90 and are more preferably contained in a range of 70/30 to 10/90.

As a urethane resin forming the composite resin particles, a urethane resin similar to the urethane resin (a1) may be used. In particular, as a polyol, a polyisocyanate, and a chain extender usable for manufacturing of the urethane resin (a1), those similar to the polyol, the polyisocyanate, and the chain extender which are shown by way of example as compounds usable for manufacturing of the urethane resin (a1) may be used. In addition, when various types of functional groups are incorporated into the composite resin particles and are subjected to a cross-linking reaction with an organic compound functioning as a protective agent for the particles (b), a method similar to that for incorporating functional groups into the urethane resin (a1) may also be used.

In addition, when a urethane resin having an aliphatic cyclic structure is used as the urethane resin forming the composite resin particles, as the polyol, a polyol having an aliphatic cyclic structure is preferably used, and as the polyisocyanate, a polyisocyanate having an aliphatic cyclic structure is preferably used. By the use of those materials, an aliphatic cyclic structure can be incorporated into the urethane resin.

As the polyol having an aliphatic cyclic structure, for example, there may be used a relatively low molecular weight polyol having an aliphatic cyclic structure, such as 1,4-cyclohexanedimethanol, cyclobutanediol, cyclopentanediol, 1,4-cyclohexanediol, cycloheptanediol, cyclooctanediol, cyclohexanedimethanol, tricyclo[5,2,1,0,2,6]decanedimethanol, bicyclo[4,3,0]-nonanediol, dicyclohexanediol, tricyclo[5,3,1,1]dodecanediol, bicyclo[4,3,0]-nonanedimethanol, tricyclo[5,3,1,1]dodecanediethanol, spiro[3,4]octanediol, butylcyclohexanediol, 1,1'-bicyclohexylidenediol, cyclohexanetriol, hydrogenated bisphenol A, or 1,3-adamantanediol.

As the polyol having an aliphatic cyclic structure, besides those mentioned above, a compound obtained by a reaction between a poly(carboxylic acid) having an aliphatic cyclic structure and an aliphatic polyol may also be used.

As the poly(carboxylic acid) having an aliphatic cyclic structure, for example, there may be used 1,3-cyclopentane dicarboxylic acid, 1,2-cyclohexane dicarboxylic acid, 1,3-cyclohexane dicarboxylic acid, 1,4-cyclohexane dicarboxylic acid, or an anhydride or an ester thereof, and in particular, a poly(carboxylic acid) having an aliphatic cyclic structure, such as 1,2-cyclohexane dicarboxylic acid or 1,4-cyclohexane dicarboxylic acid, is preferably used.

As a polyol usable for an esterification reaction with the poly(carboxylic acid) having an aliphatic cyclic structure, besides 1,6-hexanediol mentioned above, an aliphatic polyol, such as ethylene glycol, diethylene glycol, triethylene glycol, 1,2-propylene glycol, 1,3-propylene glycol, dipropylene glycol, 1,4-butanediol, 1,3-butanediol, 1,2-butanediol, 2,3-butanediol, 1,5-pentanediol, 1,5-hexanediol, 2,5-hexanediol, 1,6-hexanediol, 1,7-heptanediol, 1,8-octanediol, 1,9-nonanediol, 1,10-decanediol, neopentyl glycol, 3-methyl-1,5-pentanediol, or 2-methyl-1,3-propanediol, may be used. When an esterification reaction is performed between the polyol having an aliphatic cyclic structure and the poly(carboxylic acid), the aliphatic polyol may also be used in combination therewith.

As the polyol having an aliphatic cyclic structure, for example, a polycarbonate polyol having an aliphatic cyclic structure may be used. As the polycarbonate polyol having an aliphatic cyclic structure, for example, a compound obtained by a reaction of the low molecular weight polyol having an aliphatic cyclic structure with dimethyl carbonate, phosgene, or the like may be used.

As the polycarbonate polyol having an aliphatic cyclic structure, a polycarbonate polyol having an aliphatic cyclic structure and a number average molecular weight of 800 to 3,000 is preferably used, and a polycarbonate polyol having a number average molecular weight of 800 to 2,000 is more preferably used.

As the polyol having an aliphatic cyclic structure, for example, a polyether polyol having an aliphatic cyclic structure may be used. As the polyether polyol having an aliphatic cyclic structure, for example, there may be used a compound obtained by addition polymerization of an alkylene oxide, such as ethylene oxide or propylene oxide, using the low molecular weight polyol having an aliphatic cyclic structure as an initiator.

In addition, as a polyisocyanate having an aliphatic cyclic structure usable for manufacturing of the urethane resin forming the composite resin particles, there may be used a compound similar to the polyisocyanate having an aliphatic cyclic structure which is shown by way of example as a compound capable of manufacturing the urethane resin (a1).

In addition, when the hydrophilic group is incorporated into the urethane resin forming the composite resin particles, there may be used a compound similar to the polyol having a hydrophilic group which is shown by way of example as a compound usable for manufacturing of the urethane resin (a1).

As a vinyl resin forming the composite resin particles, a resin having a glass transition temperature of 10° C. to 70° C. is preferably used since the adhesion to the particles (b1) contained in the ink (b) to be formed into plating cores is further improved, and the plating deposition property of an obtained plating core pattern is further improved. In addition, the glass transition temperature of the vinyl resin is a value obtained by calculation based on the composition of vinyl monomers used for manufacturing of the vinyl resin.

In addition, as the vinyl resin forming the composite resin particles, a resin having a weight average molecular weight of 800,000 or more is preferably used since a coating film which is a precursor of the receiving layer can be formed, the adhesion of the particles (b1) to be formed into plating cores can be improved, and the width of each line of a plating core pattern to be obtained can be reduced, and a resin having a weight average molecular weight of 1,000,000 or more is more preferably used.

Although the upper limit of the weight average molecular weight of the vinyl resin forming the composite resin particles is not particularly limited, approximately 10,000,000 or less is preferable, and 5,000,000 or less is preferable.

In addition, the vinyl resin forming the composite resin particles may have various types of functional groups if needed, and as the functional group, for example, a cross-linkable functional group, such as an amide group, a hydroxyl group, a glycidyl group, an amino group, a silyl group, an aziridinyl group, an isocyanate group, an oxazoline group, a cyclopentenyl group, an allyl group, a carboxyl group, or an acetoacetyl group, may be mentioned.

As the vinyl resin forming the composite resin particles, a resin similar to the vinyl resin (a2) may be used. In particular, as a monomer having a polymerizable unsaturated double bond which is usable for manufacturing of the vinyl resin (a2), the vinyl monomer shown by way of example as a compound usable for manufacturing of the vinyl resin (a2) may be mentioned, and a monomer similar to a (meth)acrylic monomer may be preferably used. In addition, when a functional group is incorporated into the vinyl resin forming the composite resin particles, a method similar to the method for incorporating a functional group into the vinyl resin (a2) may also be used.

The composite resin particles may be manufactured, for example, by a step of performing a reaction between the polyisocyanate and the polyol together with a chain extender if needed, and dispersing a reaction product in an aqueous medium to form an aqueous dispersion of a urethane resin and a step of polymerizing a monomer, such as a (meth)acrylic monomer, in the above aqueous dispersion to manufacture a vinyl resin.

In particular, after a urethane resin is obtained by a reaction between the polyisocyanate and the polyol in the absence of solvents, in the presence of an organic solvent, or in the presence of a reactive diluent, such as a (meth)acrylic monomer, the hydrophilic group of the urethane resin is partially or entirely neutralized if needed with a basic compound, and the urethane resin is further allowed to react with a chain extender if needed and is then dispersed in an aqueous medium, so that an aqueous dispersion of the urethane resin is obtained.

Next, the monomer, such as the (meth)acrylic monomer, is supplied to the aqueous dispersion of the urethane resin thus obtained, and the vinyl monomer in the urethane resin particles is subjected to radical polymerization to manufacture a vinyl resin. Alternatively, when the manufacturing of the urethane resin is performed in the presence of a vinyl monomer, after the urethane resin is manufactured, a polymerization initiator and the like are supplied, and the monomer, such as a (meth)acrylic monomer, is subjected to radical polymerization to manufacture a vinyl resin.

As a result, a resin composition can be manufactured in which composite resin particles usable as a resin contained in the composition (a) are dispersed in an aqueous medium, the composite resin particles including urethane resin particles and a vinyl resin which is partially or entirely enclosed in the particles.

When the composite resin particles are manufactured, if the workability is not excellent since a urethane resin has a high viscosity, a common organic solvent, such as methyl ethyl ketone, N-methylpyrrolidone, acetone, or dipropylene glycol dimethyl ether, and/or a reactive diluent may be used. In particular, a monomer, such as a (meth)acrylic monomer, usable for manufacturing of the vinyl resin is preferably used as the reactive diluent since the production efficiency can be improved by omitting a solvent removing step.

In addition, the composition (a) may also contain other types of compounds, resins, and/or the like. In particular, when the particles (b1) to be formed into plating cores which will be described later are protected by an organic compound, a compound and/or a resin having a functional group cross-linkable with this organic compound is also preferably used since the adhesion between the receiving layer (A) and the plating core pattern (B) is promoted.

For example, when the functional group is an isocyanate group, there may be used a polyisocyanate, such as tolylene diisocyanate, hydrogenated tolylene diisocyanate, triphenylmethane triisocyanate, methylenebis(4-phenylmethane)triisocyanate, isophorone diisocyanate, hexamethylene diisocyanate, or xylylene diisocyanate; a nurate type polyisocyanate obtained using the compound mentioned above; or an adduct formed therefrom with trimethylolpropane or the like. In particular, a nurate of hexamethylene diisocyanate, an adduct of hexamethylene diisocyanate and trimethylolpropane, an adduct of tolylene diisocyanate and trimethylolpropane, or an adduct of xylylene diisocyanate and trimethylolpropane is preferably used.

In addition, as a compound in which the functional group is an isocyanate group, a compound in which the isocyanate group is partially or entirely blocked by a blocking agent may be used.

As the blocking agent, for example, there may be used phenol, cresol, 2-hydroxypyridine, butyl cellosolve, propylene glycol monomethyl ether, benzyl alcohol, methanol, ethanol, n-butanol, isobutanol, dimethyl malonate, diethyl malonate, methyl acetoacetate, ethyl acetoacetate, acetylacetone, butyl mercaptan, dodecyl mercaptan, acetanilide, amide acetate, ε-caprolactam, δ-valerolactam, γ-butyrolactam, imide succinate, imide maleate, imidazole, 2-methylimidazole, urea, thiourea, ethylene urea, formamide oxime, acetaldoxime, acetone oxime, methyl ethyl ketone oxime, methyl isobutyl ketoxime, cyclohexanone oxime, diphenylaniline, aniline, carbazole, ethyleneimine, or a polyethyleneimine.

As for the blocked isocyanate compound, as an aqueous dispersion type commercially available product, for example, Elastron BN-69 (manufactured by Dai-ichi Kogyo Seiyaku Co., Ltd.) may be used.

In addition, as a compound in which the functional group is an epoxy group, for example, there may be used a polyglycidyl ether of an aliphatic polyhydric alcohol, such as ethylene glycol diglycidyl ether, propylene glycol diglycidyl ether, hexamethylene glycol diglycidyl ether, cyclohexanediol diglycidyl ether, glycerin diglycidyl ether, glycerin triglycidyl ether, trimethylolpropane triglycidyl ether, or pentaerythritol tetraglycidyl ether; a polyglycidyl ether of a poly(alkylene glycol), such as a poly(ethylene glycol) diglycidyl ether, a poly(propylene glycol) diglycidyl ether, or a poly(tetramethylene glycol) diglycidyl ether; a polyglycidylamine, such as 1,3-bis(N,N'-diglycidylaminoethyl)cyclohexane; a polyglycidyl ester of a poly(carboxylic acid) [oxalic acid, adipic acid, butane tricarboxylic acid, maleic acid, phthalic acid, terephthalic acid, isophthalic acid, benzene tricarboxylic acid, or the like]; a bisphenol A epoxy resin, such as a condensate of bisphenol A and epichlorohydrin or an ethylene oxide adduct of a condensate of bisphenol A and epichlorohydrin; a phenol novolac resin; or various types of vinyl polymers each having an epoxy group on its side chain. Among those compounds mentioned above, a polyglycidylamine, such as 1,3-bis(N,N'-diglycidylaminoethyl)cyclohexane, or a polyglycidyl ether of an aliphatic polyhydric alcohol, such as glycerin diglycidyl ether, is preferably used.

In addition, as the compound in which the functional group is an epoxy group, besides the compounds mentioned above, for example, there may also be used a silane compound having a glycidyl group, such as γ-glycidoxypropyltrimethoxysilane, γ-glycidoxypropyltriethoxysilane, γ-glycidoxypropylmethyldimethoxysilane, γ-glycidoxypropylmethyldiethoxysilane, β-(3,4-epoxycyclohexyl)ethyltrimethoxysilane, β-(3,4-epoxycyclohexyl)ethyltriethoxysilane, β-(3,4-epoxycyclohexyl)ethylmethyldiethoxysilane, or γ-glycidoxypropyltriisopropenyloxysilane.

In addition, as a compound in which the functional group is a vinyl group, for example, there may be used a polyfunctional vinyl monomer, such as a (poly)ethylene glycol di(meth)acrylate, a (poly)propylene glycol di(meth)acrylate, a (poly)butylene glycol di(meth)acrylate, a (poly)neopentyl glycol di(meth)acrylate, N,N'-methylene bis(meth)acrylamide, trimethylolpropane triacrylate, pentaerythritol triacrylate, trimethylolpropane EO-added triacrylate, glycerin PO-added triacrylate, trisacryloyloxyethyl phosphate, pentaerythritol tetraacrylate, tricyclodecanedimethanol diacrylate, dipentaerythritol hexaacrylate, ditrimethylolpropane tetraacrylate, or pentaerythritol tetraacrylate. The compound described above may also be used in the form of an aqueous dispersion by using an arbitrary surfactant if needed.

In addition, as a compound in which the functional group is a carboxyl group or a carboxylic anhydride group, for example, there may be used at least one type of monomer selected from the group consisting of dibasic acids, such as oxalic acid, tartaric acid, succinic acid, malic acid, maleic acid, fumaric acid, phthalic acid, sebacic acid, dodecanedioic acid, eicosanedioic acid, isodocosadienoic diacid, isodocosanedioic acid, isoeicosadienoic diacid, butyloctanedioic acid, dialkoxycarbonyl isodocosadienoic diacid, and a partially neutralized salt thereof; tribasic acids, such as citric acid, aconitic acid, and a partially neutralized salt thereof; a vinyl monomer having a carboxylic acid group, such as acrylic acid, methacrylic acid, β-carboxyethyl(meth)acrylate, 2-(meth)acryloylpropionic acid, crotonic acid, itaconic acid, maleic acid, fumaric acid, an itaconic acid half ester, and a maleic acid half ester; and a vinyl monomer having a carboxylic anhydride group including a carboxyl group-containing vinyl monomer, such as maleic anhydride, itaconic anhydride, citraconic anhydride, β-(meth)acryloyloxyethyl hydrogen succinate, citraconic acid, a citraconic acid half ester, and citraconic anhydride.

In addition, as a compound in which the functional group is an N-alkylol group, for example, there may be used, besides mono- or a polymethylolmelamine in which 1 to 6 moles of formaldehyde are added to 1 mole of melamine; an etherified product of a (poly)methylolmelamine (having an arbitrary etherification degree), such as trimethoxymethylolmelamine, tributoxymethylolmelamine, or hexamethoxymethylolmelamine; a urea-formaldehyde-methanol condensate, a urea-melamine-formaldehyde-methanol condensate, a poly N-(alkoxy)methylol (meth)acrylamide, and a formaldehyde adduct of a poly(meth)acrylamide.

Besides a cross-linking agent (a4), the composition (a) described above may also contain, if needed, a pH controller, a coating film forming auxiliary agent, a leveling agent, a thickening agent, a water repellent agent, a defoaming agent, a pigment, an organic and/or an inorganic filler, and the like.

As the cross-linking agent (a4), besides a heat cross-linking agent (a4-1), such as a metal chelate compound, a polyamine compound, an aziridine compound, a metal salt compound, or the aforementioned isocyanate compound, which is reactive with a cross-linkable functional group in the resin and which can form a cross-linked structure by a reaction at a relatively low temperature of approximately 25° C. to 100° C., a heat cross-linking agent (a4-2) which includes at least one selected from the group consisting of a melamine-based compound, the aforementioned epoxy-based compound, an oxazoline compound, a carbodiimide compound, and the aforementioned blocked isocyanate compound and which can form a cross-linked structure by a reaction at a relatively high temperature of approximately 100° C. or more may be used alone or together with another resin, such as the above urethane resin or vinyl resin, by mixing. When being reactable with the urethane resin (a1), the vinyl resin (a2), and the composite resin particles, the cross-linking agent (a4) may react with a part thereof.

In the case in which a composition containing the heat cross-linking agent (a4-1) is used as the composition (a), for example, after the composition is applied onto a substrate surface and dried at a relatively low temperature, and the ink (b) containing the particles (b1) to be formed into plating cores is further printed by reverse offset printing, a cross-linked structure is formed by heating to a temperature of less than 100° C. As a result, a plating core pattern (B) having significantly excellent durability can be formed so that the plating core particles (b1) are prevented for a long period of time from falling even if heat and external force are applied thereto.

Alternatively, in the case in which a composition containing the heat cross-linking agent (a4-2) is used as the composition (a), for example, after the composition is applied onto a substrate surface and dried at a relatively low temperature of room temperature (25° C.) to approximately less than 100° C. to form a coating film in which a cross-linked structure is not formed, and the ink (b) is further printed on the surface thereof by reverse offset printing, a cross-linked structure is formed by heating, for example, to a temperature of 150° C. or more or preferably 200° C. or more. As a result, a plating core pattern (B) having significantly excellent durability can be obtained so that the particles (b1) to be formed into plating cores are prevented for a long period of time, for example, from being peeled off even if heat, external force, and the like are applied thereto. However, when a substrate formed, for example, of a poly(ethylene terephthalate) having a relatively low heat resistance is used as the substrate, in order to prevent the deformation of the substrate or the like, heating is preferably performed at a temperature of approximately 150° C. or less and preferably 120° C. or less. In the case as described above, as the cross-linking agent, the heat cross-linking agent (a4-1) is preferably used instead of using the heat cross-linking agent (a4-2).

As the metal chelate compound usable as the heat cross-linking agent (a4-1), for example, an acetylacetone coordinate compound or an acetoacetate coordinate compound of a polyvalent metal, such as aluminum, iron, copper, zinc, tin, titanium, nickel, antimony, magnesium, vanadium, chromium, or zirconium, may be used, and acetylacetone aluminum, which is an acetylacetone coordinate compound of aluminum, is preferably used.

In addition, as the polyamine compound usable as the heat cross-linking agent (a4-1), for example, a tertiary amine, such as triethylenediamine, or POLYMENT NK-100PM or NK-200PM (aminoethylated acrylic polymer manufactured by Nippon Shokubai Co., Ltd.) may also be used.

In addition, as the aziridine compound usable as the heat cross-linking agent (a4-1), for example, 2,2-bishydroxymethylbutanol-tris[3-(1-aziridinyl)propionate], 1,6-hexamethylenediethyleneurea, or diphenylmethane-bis-4,4'-N,N'-diethyleneurea may be used.

In addition, as the metal salt compound usable as the cross-linking agent (a4-1), for example, there may be used an aluminum-containing compound, such as aluminum sulfate, aluminum alum, aluminum sulfite, aluminum thiosulfate, poly(aluminum chloride), aluminum nitrate nonahydrate, or aluminum chloride hexahydrate; or a water-soluble metal salt, such as titanium tetrachloride, tetraisopropyl titanate, titanium acetylacetonate, or titanium lactate.

In addition, as the melamine compound usable as the heat cross-linking agent (a4-2), for example, there may be used hexamethoxymethylmelamine, hexaethoxymethylmelamine, hexapropoxymethylmelamine, hexabutoxymethylmelamine, hexapentyloxymethylmelamine, hexahexyleoxymethylmelamine, or a mixed etherified melamine containing two of those melamine compounds in combination. In particular, trimethoxymethylmelamine or hexamethoxymethylmelamine is preferably used. As a commercially available product, Beckamine M-3, APM, and J-101 (manufactured by DIC Corp.) may be used. The above melamine compounds each can form a cross-linked structure by a self-cross-linking reaction.

In the case in which at least one of the above melamine compounds is used, in order to promote the self-cross-linking reaction thereof, a catalyst such as an organic amine salt may also be used. As a commercially available product, for example, Catalyst ACX or 376 may be used. The content of the catalyst is preferably in a range of 0.01 to 10 percent by mass with respect to the total mass of the melamine compound.

In addition, as the oxazoline compound usable as the heat cross-linking agent (a4-2), for example, there may be used 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane)sulfide, or bis-(2-oxazolinylnorbornane)sulfide.

In addition, as the oxazoline compound, an oxazoline group-containing polymer may be used which is obtained by polymerizing the following addition-polymerizable oxazoline in combination with another monomer if needed.

As the addition-polymerizable oxazoline, for example, 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, and 2-isopropenyl-5-ethyl-2-oxazoline may be used alone, or at least two types thereof may be used in combination. Among those compounds mentioned above, 2-isopropenyl-2-oxazoline is preferably used owing to its easy industrial availability.

In addition, as the carbodiimide compound usable as the heat cross-linking agent (a4-2), for example, a poly[phenylenebis(dimethylmethylene)carbodiimide] or a poly(methyl-1,3-phenylenecarbodiimide) may be used. As a commercially available product, for example, Carbodilite V-01, V-02, V-03, V-04, V-05, or V-06 (manufactured by Nisshinbo Holdings Inc.) and UCARLINK XL-29SE or XL-29MP (manufactured by Union Carbide Corp.) may be used.

Although the content of the cross-linking agent (a4) with respect to 100 parts by mass of the total mass of resin components contained in the composition (a) depends on the type and the like, since the plating core pattern (B) excellent in adhesion and durability can be formed, in general, the cross-linking agent (a4) is used preferably in a range of 0.01 to 60 percent by mass, more preferably 0.1 to 10 percent by mass, and even more preferably 0.1 to 5 percent by mass.

A poly(vinyl alcohol), a poly(vinyl pyrrolidone), or the like, which is a typical water-soluble resin, has been primarily used to impart coatability to a water-based coating solution. However, a resin layer for the water-based coating solution has not sufficient adaptability to a solvent-based coating solution, and "uncoated spots" and/or unevenness occurs. As a result, in general, a problem of coatability may arise.

When the urethane resin and the vinyl resin described above are used alone or in combination by mixing as the resin composition (a) used in the present invention, even if a water soluble resin, such as a poly(vinyl alcohol), is not used, or the use amount thereof is minimized, the composition may be applied to either a water-based coating solution or a solvent-based coating solution. Hence, in any case in which as the solvent contained in the ink (b) containing the particles (b1) to be formed into plating cores which will be described later, water, a mixed solvent containing water and a water-soluble organic solvent, or an organic solvent containing no water is used, a receiving layer (A) having excellent coatability can be formed.

Even in the case in which the urethane resin (a1) and the vinyl resin (a2) are used in combination with a water soluble resin, with respect to the total mass of the urethane resin (a1) and the vinyl resin (a2), the water soluble resin is used preferably in a range of 15 percent by mass or less, more preferably in a range of 0 to 10 percent by mass, further preferably in a range of 0 to 5 percent by mass, and particularly preferably 0 to 0.5 percent by mass.

In addition, when a microporous type receiving layer is formed, a large amount of filler, such as silica, alumina, and/or starch, is used. In addition, when a swelling type receiving layer is formed, in order to impart an anti-blocking property thereto, a small amount of filler may also be used in some cases.

Even in the case in which the filler such as silica is not used for the resin composition (a) used in the present invention, or the use amount of the filler therefor is minimized, when an ink (b) containing as a solvent, any one of water, a mixed solvent containing water and a water-soluble organic solvent, and an organic solvent containing no water is used, "uncoated spots" and unevenness are not generated, and hence, a receiving layer capable of ensuring excellent coatability can be formed.

Accordingly, even if a filler is used, in order to form a receiving layer (A) which can ensure excellent coatability, the content of the filler with respect to the total mass of the resin component of the composition (a) is preferably in a range of 15 percent by mass or less, preferably 0 to 10 percent by mass, and particularly preferably 0 to 0.5 percent by mass. In particular, in order to prevent a decrease in adhesion of a film or the like to a flexible substrate, the use amount of the filler is preferably in the range described above.

A method for coating the resin composition (a) on the substrate surface is not particularly limited as long as the receiving layer (A) is appropriately formed, and if needed, various printing and coating methods may be appropriately selected in accordance with the shape, the size, and the degree of hardness of a substrate to be used. In particular, for example, there may be mentioned a gravure method, an offset method, a relief method, a reverse offset method, a screen method, a microcontact method, a reverse method, an air doctor coater method, a blade coater method, an air knife coater method, a squeeze coater method, an impregnation coater method, a transfer roll coater method, a kiss coater method, a cast coater method, a spray coater method, an inkjet method, a die method, a spin coater method, a bar coater method, or a dip coat method.

In addition, although a method for drying a coating film after the resin composition (a) is applied on the substrate is not particularly limited, when the substrate is a precut film, sheet, or plate, besides spontaneous drying at a coating operation place, drying may be performed in a dryer, such as an air-blow or a constant-temperature dryer. In addition, when the substrate is a rolled sheet, after the printing/coating step, drying may be performed in a non-heated or a heated space provided at a downstream side thereof by continuously moving the rolled sheet.

A drying temperature may be set in a temperature range in which the medium (a3) forming the resin composition (a) can be vaporized, and the substrate functioning as a support member is not adversely influenced. In particular, when the cross-linking agent (a4-1) is used, drying is preferably performed at a temperature of approximately 25° C. or less than 100° C., and when the cross-linking agent (a4-2) is used, the temperature is preferably approximately 100° C. or more and preferably approximately 120° C. to 300° C. On the other hand, when the cross-linking agent (a4-2) is used, and a cross-linked structure is formed after the ink (b) is printed, it is preferably controlled so that drying is performed at a relatively low temperature of room temperature (25° C.) to approximately 100° C. not to form a cross-linked structure before the printing.

The thickness of the receiving layer (A) formed on the substrate surface may be appropriately adjusted in accordance with the type and the thickness of the substrate, and in consideration of the amount of the solvent contained in the ink (b) which will be described later and in order to maintain various characteristics of the substrate, the thickness after drying is preferably 300 μm or less and more preferably 20 μm or less. Furthermore, when the substrate has a film shape having a thickness of 50 μm or less, the thickness of the receiving layer (A) is preferably 1 μm or less and more preferably 10 to 500 nm.

The receiving layer (A) obtained as described above is a swelling type receiving layer which can accurately fixing the particles (b1) contained in the ink (b) to be formed into plating cores since this layer is appropriately dissolved in a solvent contained in the ink (b) which will be described later and absorbs the solvent, and hence, a plating core pattern (B) having no blurring can be obtained. In addition, by the use of the receiving layer (A), compared to a related porous type receiving layer, a transparent resin layer can be formed.

<Ink (B) Containing Particles (b1) to be Formed into Plating Cores>

The ink (b) (hereinafter simply referred to as "plating core ink") containing the particles (b1) to be formed into plating cores, which is used in the present invention, is an ink using the receiving layer (A) formed on the substrate as an ink pattern-receiving member to which the ink is to be transferred.

The volume average particle diameter (Mv=Mean Volume Diameter) of the particle diameters of the particles (b1) to be formed into plating cores is preferably 2 to 150 nm and more preferably in a range of 5 to 100 nm. By the use of the particles having a nano-order particle diameter as described above, excellent transfer printability can be obtained which may be probably caused by improvement in interparticle cohesion force in a semi-dried state of the ink (b). In addition, when fine particles are used, a finer pattern can be formed.

As the particles (b1) to be formed into plating cores, for example, besides metal particles of gold (Au), silver (Ag), copper (Cu), nickel (Ni), zinc (Zn), aluminum (Al), iron (Fe), platinum (Pt), palladium (Pd), tin (Sn), chromium (Cr), lead (Pb), or the like, a metal alloy thereof, such as a palladium alloy (Ag/Pd), and core-shell particles; and electrically conductive metal oxide particles, such as zinc oxide (ZnO), indium tin oxide (ITO), or oxide indium zinc oxide (IZO), if needed, there may also be contained electrically conductive high molecular particles formed, for example, of a thermally decomposable compound, such as a metal complex including a silver carboxylate or a silver aminocarboxylate, or silver oxide ($Ag_2O$), each of which is thermally decomposed into an electrically conductive metal by firing at 200° C. or less; or a polyethylenedioxythiophene/poly (styrene sulfonic acid) (PEDOT/PSS).

Among those particles, particles of silver and/or copper, that is, nano silver particles, nano copper silver particles, alloy nano particles of silver and copper, and core-shell particles using silver and/or copper as cores, are preferable since good electrical conductivity and plating deposition property can be obtained.

Since the particles (b1) to be formed into plating cores preferably have a nanometer order size, the particles (b1) are preferably stabilized by protection with an organic compound.

As an organic compound usable as the protective agent for the particles (b1) to be formed into plating cores, compounds known as various types of dispersants and surfactants may be used, and for example, there may be used an amine-based high molecular dispersant, such as a polyethyleneimine or a polyvinylpyrrolidone; a hydrocarbon-based high molecular dispersant having a carboxylic acid group in its molecule, such as a poly(acrylic acid) or a carboxymethyl cellulose; or a high molecular dispersant having a polar group, such as a poly(ethylene glycol), an alkylthiol, a poly(vinyl alcohol), a styrene-maleic acid copolymer, an olefin-maleic acid copolymer, or a copolymer having a polyethyleneimine portion and a poly(ethylene oxide) portion in one molecule. Although a mixture of those compounds mentioned above and/or the copolymer thereof has been generally used, when this resin composition (a) contains the urethane resin (a1) having a weight average molecular weight of 5,000 or more or the vinyl resin (a2) and the medium (a3) dispersing or dissolving the above resin, in consideration of adhesion to the receiving layer (A), an organic compound having a functional group reactive with functional groups contained in the urethane resin (a1), the vinyl resin (a2), and the composite resin particles thereof is preferable, and an organic compound containing a basic nitrogen atom, such as an imino group, a primary amino group, or a secondary amino group, is preferable since performance balance among the storage stability of the ink (b), the adhesion to the receiving layer (A), and the like is excellent.

The plating core ink may contain various types of binder resins, and in particular, there may be mentioned a natural rubber, an olefinic resin, a polyether, such as a poly(ethylene oxide), or a poly(propylene oxide), an unsaturated polyester resin, an acrylic resin, a phenol resin, a melamine resin, a benzoguanamine resin, an epoxy resin, a urethane resin, a vinyl polyester resin, a petroleum resin, a rosin resin, a silicone resin, a vinyl resin, such as a poly(vinyl alcohol), vinyl chloride, vinyl acetate, or a vinyl chloride-vinyl acetate copolymer, a cellulose resin, or a natural polysaccharide.

In order to obtain preferable metal deposition starting from the plating core pattern (B) by electrolytic plating, the organic compound used as the protective agent for the particles (b1) to be formed into plating cores and/or a binder component which is arbitrarily added is contained in an amount of preferably 15 percent by mass or less, more preferably 10 percent by mass or less, and further preferably 5 percent by mass or less with respect to the total mass of the particles (b1) contained in the plating core ink to be formed into plating cores.

In addition, in order to obtain preferable printing by a reverse offset printing method, the plating core ink preferably contains a surface energy control agent. As the surface energy control agent, a fluorine-based surface energy control agent and/or a silicone-based surface energy control agent is preferably used. For example, as the fluorine-based surface energy control agent, Megafac Series by DIC Corp. and Novec Series by 3M may be used. Among those mentioned above, a fluorine-based surface energy control agent formed from a fluorinated (meth)acrylic polymer by DIC Corp. is preferably used. As the silicone-based surface energy control agent, BYK Series by BYK Japan KK is preferably used. A fluorine-based surface energy control agent and a water-compatible silicone-based surface energy control agent are more preferably used in combination. By the use of the two types described above in combination, with a small addition amount thereof to the ink, minute ink repelling at a release surface of a blanket can be suppressed. Although a mixing ratio between the fluorine-based surface energy control agent and the silicone-based surface energy control agent is not particularly limited, when a mixing ratio of the fluorine-based surface energy control agent/silicone-based surface energy control agent is set to 1/1 to 1/0.1, a significant effect can be obtained.

In consideration of the balance among inhibition of ink repelling on the blanket, uniformity of a coating film, an electrically conductive property of an ink coating film after firing, and a plating deposition property, the addition of the surface energy control agent mentioned above is performed in a range of 0.05 to 5.0 percent by mass in the total ink (b) and preferably in a range of 0.1 to 0.5 percent by mass.

By addition of the surface energy control agent described above, the surface energy of the plating core ink at 25° C. is preferably controlled to 25 mN/m or less. Accordingly, since the smoothness of an ink coating film applied on a liquid-repellent release surface of the blanket is improved, a more uniform coating film can be obtained.

In addition, in order to suppress minute ink repelling on the release surface of the blanket, the release surface may be treated by an ozone UV or an ozone plasma treatment.

In order to improve line pattern formability and pattern transferability, if needed, a release agent may be added to the plating core ink of the present invention. As the release agent, a silicone oil, such as KF96 series manufactured by Shin-Etsu Chemical Co., Ltd. and SH28 manufactured by Dow Corning Toray Co., Ltd. (each of which is the trade name), may be preferably mentioned. In particular, a low molecular weight silicone (having a molecular weight of approximately 148 to 2,220), which is a dimer to a 30-mer of silicone, is preferable since having a little influence on ink patterning, electrical conductivity of a fired coating film, and a plating deposition property. As the silicone oil described above, a silicone having a dynamic viscosity of 20 mm/s or less at 25° C., which is one of KF96 Series manufactured by Shin-Etsu Chemical Co., Ltd., may be mentioned. The content of this release agent is 0.05 to 5.0 percent by mass in the total ink (b) and is preferably in a range of 0.1 to 1.0 percent by mass. By the addition of this release agent, even if the wettability of ink to the blanket is increased by controlling a solvent and/or surface energy, the peeling property from the blanket can be ensured. Accordingly, the transferability in a reverse offset printing method can be improved.

In order to further stabilize the dispersibility of the particles (b1) to be formed into plating cores and to promote low temperature firing, if needed, an alkyl amine, such as diethylamine, triethylamine, or diisopropylamine; an ethanolamine, such as monoethanolamine, diethanolamine, or triethanolamine; various ammonium carbonates, various ammonium carbamates, formic acid, acetic acid, propionic acid, nitric acid, phosphoric acid, hydrogen peroxide, an amine compound such as amine nitrate, an inorganic acid, or an organic acid may be added to the plating core ink of the present invention.

A dispersion solvent applicable to the plating core ink is not particularly limited as long as the particles (b1) which are to be used or a mixture thereof can be stably dispersed. As the solvent described above, the following solvents may be appropriately used alone or in combination. For example, there may be mentioned water; an alcohol, such as methanol, ethanol, butyl alcohol, isopropyl alcohol, methoxybutanol, or tertiary butanol; a polyhydric alcohol, such as ethylene glycol, propylene glycol, diethylene glycol, or glycerin; an ester, such as ethyl acetate, methyl acetate, propyl acetate, isopropyl acetate, isobutyl acetate, methoxybutyl acetate, or ethyl lactate, and a carbonate ester, such as dimethyl carbonate, dimethyl carbonate, or propylene carbonate; an ether, such as isopropyl ether, dioxane, methyl tertiary butyl ether, or tetrahydrofuran; a ketone, such as acetone, methyl ethyl ketone, methyl butyl ketone, methyl isobutyl ketone, cyclohexanone, or diacetone alcohol; a glycol ether, such as methyl cellosolve, cellosolve, butyl cellosolve, diethylene glycol monomethyl ether, propylene glycol n-propyl ether, dipropylene glycol monomethyl ether, propylene glycol monomethyl ether, or propylene glycol monoethyl ether; a glycol acetate, such as ethylene glycol monomethyl ether acetate or propylene glycol monomethyl ether acetate; a glycol diether, such as methyl monoglyme, methyl diglyme, methyl triglyme, or ethyl monoglyme; an alicyclic hydrocarbon, such as cyclohexanone, methylcyclohexanone, cyclohexanol, or methylcyclohexanol; an aliphatic hydrocarbon such as normal hexane; an aromatic hydrocarbon, such as toluene or xylene; a chlorinated aromatic hydrocarbon, such as chlorobenzene or ortho dichlorobenzene; or a chlorinated aliphatic hydrocarbon, such as dichloromethane, chloroform, carbon tetrachloride, dichloroethylene, or trichloroethylene. Among those mentioned above, a mixed type solvent primarily containing an alcoholic solvent is preferable.

In addition, in order to form a uniform ink film of the ink (b) having no minute repelling and no defects, a solvent which swells a blanket release surface may be contained in the solvent. In the reverse offset printing, first, it is required to form a uniform thin ink film having no defects on a smooth liquid-repellent release surface of the blanket. In this step, if minute repelling occurs, a pattern defect is generated. The content of a blanket release surface swelling solvent in the total solvent is preferably 5% to 70% on the mass basis and more preferably 20% to 50%. For example, when a silicone rubber is used for the blanket release surface, as the blanket swelling liquid in this case, a solvent is preferably used which achieves a rate of increase in rubber weight of 10% or more or more preferably of 20% or more when the silicone rubber is immersed in the solvent for 15 minutes. As the solvent described above, for example, there may be preferably used dimethyl carbonate, diethyl carbonate, isopropyl acetate, n-propyl acetate, butyl acetate, methoxybutyl acetate, dioxane, isopropyl alcohol, methyl monoglyme, ethyl monoglyme, methyl diglyme, ethyl diglyme, dipropylene glycol dimethyl ether, propylene glycol n-butyl ether, propylene glycol n-propyl ether, or propylene glycol monomethyl ether acetate.

<Formation of Plating Core Pattern (B) by Reverse Offset Printing>

Hereinafter, basic steps of forming a plating core pattern by reverse offset printing will be shown with reference to FIG. 1.

(Inking Step) FIG. 1(a)

A uniform ink film (FIG. 1-1) is formed by applying a plating core ink on a release surface of a blanket (FIG. 1-2) and is appropriately dried so that a pattern formation by a relief plate can be performed. In this step, drying conditions are preferably controlled by regulating ambient temperature and humidity. Furthermore, in order to shorten the drying time, dry air may be blown to an ink film surface. If the ink is not sufficiently dried, in a subsequent step (pattern formation step using a relief plate), line blurring, curving, and change in dimension (contraction) occur, and as a result, the shape of the relief plate cannot be accurately reproduced. In contrast, when the ink is excessively dried, the line linearity is degraded, and in the worst case, the ink is strongly adhered to the blanket, and as a result, an unnecessary pattern is difficult to be removed by the relief plate. Of course, a method for forming an ink film on a blanket so that a line pattern cannot be subsequently transferred from the blanket to an ink pattern-receiving member is not particularly limited, and an ink film having a predetermined thickness can be formed by slit coating, bar coating, spin coating, or the like. A wet thickness of an ink to be applied is preferably controlled to 0.1 to 1 μm in view of subsequent fine pattern formability and drying properties. As a material forming the blanket release surface, in general, a liquid repelling rubber is used. For example, silicone elastomers, such as a vinyl silicone rubber and a fluorinated silicone rubber, various types of fluorinated rubber, an ethylene-propylene rubber, and an olefinic rubber may be used. Among those mentioned above, a silicone elastomer and a fluorinated elastomer are preferably used since having excellent liquid repelling properties and pattern releasing properties. In particular, a silicone elastomer is particularly excellent as a rubber for the blanket release surface since having appropriate liquid repelling properties, solvent resistance, and solvent swelling properties. Although the structure of the blanket is not particularly limited, in order to apply a uniform pressure onto a printing surface, a blanket lined with a sponge, such as a urethane foam, is preferably used.

(Pattern Formation Step Using Relief Plate) FIG. 1(b)

Next, a relief plate (FIG. 1-3) having a negative pattern of a required plating core pattern is lightly pressed on the ink film described above and is then withdrawn therefrom, so that a pattern in contact with convex portions of the relief plate is removed. Accordingly, the plating core pattern is formed on the blanket release surface. It is important that the contact of the relief plate with the ink film surface on the blanket is performed lightly as much as possible. An excessive contact pressure is not preferable since excessive deformation of a rubber forming the blanket release surface, pattern defects (bottom contact) caused by contact between the ink film and the concave portions of the relief plate, and a decrease in pattern positional accuracy caused by blanket deformation may occur.

A material of the relief plate is not particularly limited as long as the ink film can be removed from the blanket release surface, and for example, glass, various types of metals, such as silicon and stainless steel, and various types of resins (photoresist materials) may be used. A method for forming a relief plate therefrom is not limited, and an optimum method may be selected in consideration of, for example, the material, the pattern accuracy, and the depth of the relief plate. For example, when glass or silicon is used as the material, a machining method, such as wet etching or dry etching, may be used. In the case of a metal, for example, wet etching, electrolytic plating machining, or sand blast may be used. In addition, when a resin is used as the material, a machining method, such as photolithographic etching, laser drawing, or convergent ion beam drawing, may be preferably used.

(Transfer Step) FIG. 1(c)

The plating core pattern formed on the blanket release surface is lightly brought into contact with the ink pattern-receiving member (FIG. 1-4) which is a substrate provided with the receiving layer (A) formed as described above, so that the pattern is entirely transferred thereto.

The plating core pattern thus formed is dried and/or sintered by a common ink firing method. As a common ink heat firing method, for example, there may be used hot wind oven firing, infrared radiation firing, light firing using a xenon lamp, plasma firing, or electromagnetic wave firing.

A pattern transfer mechanism of the reverse offset printing method in the present invention is not limited, and for example, there may be used a method in which a relief plate and a blanket are brought into contact with each other by a parallel plate system, a method in which a blanket wound around a roll is rotated on a flat relief plate so as to be brought into contact therewith, a method in which a relief plate is formed at a roller side and is rotated on a flat blanket so as to be brought into contact therewith, and a method in which a blanket and a relief plate are formed on respective rolls and are brought into contact with each other.

<Metal Deposition Process: Electrolytic Plating>

In the present invention, a metal is deposited by an electrolytic plating method on the surface of the plating core pattern (B) formed by the method described above, so that an electrically conductive ultrafine pattern is formed.

As an electrolytic plating liquid used for electrolytic plating, a liquid containing a metal, such as copper, nickel, chromium, cobalt, or tin, a sulfide thereof, or the like; a sulfuric acid or the like; and an aqueous medium may be used. In particular, for example, a liquid containing copper sulfate, a sulfuric acid, and an aqueous medium may be used.

When the electrolytic plating liquid described above is used, the temperature thereof is preferably in a range of approximately 20° C. to 98° C.

In the above electrolytic plating treatment method, since a highly toxic substance is not used, and the workability is excellent, a layer is preferably formed from copper by an electrolytic plating method.

In the present invention, by the steps described above, an electrically conductive ultrafine pattern having a plating layer can be obtained which has a significantly excellent durability at a level at which excellent electrical conductivity is maintained without causing any peeling between layers, and hence, this ultrafine pattern can be used for various types of electrical circuits. In particular, for example, among the formation of circuit-forming substrates used for an electric circuit, an integrated circuit, and the like using a silver ink or the like; the formation of layers and peripheral wires forming an organic solar cell and an electronic book terminal, an organic EL, an organic transistor, a flexible printed circuit board, a RFID, and the like; and wires for electromagnetic wave shielding of a plasma display, the electrically conductive ultrafine pattern described above can be preferably used for applications which particularly require the durability. In particular, the electrically conductive pattern processed by a plating treatment described above can form a highly reliable wire pattern which can maintain a preferable electrical conductivity for a long period of time without causing any wire breakages and the like, and hence the electrically conductive pattern described above is generally called a copper clad laminate (CCL) and can be used for applications of a flexible printed board (FPC), tape automated bonding (TAB), a chip on film (COF), a printed wire board (PWB), and the like.

EXAMPLES

Hereinafter, the present invention will be described in detail with reference to examples. In addition, unless otherwise particularly noted, "%" is on the mass basis.

<Synthesis of Dispersion of Silver Nano Particles Protected by Organic Compound>

[Synthesis of Tosylated Poly(Ethylene Glycol)]

A solution formed by mixing 150 g [30 mmol] of a mono-methoxylated poly(ethylene glycol) (hereinafter referred to as "PEGM") [number average molecular weight (Mn): 5,000](manufactured by Aldrich) and 24 g (300 mmol) of pyridine with 150 ml of chloroform and a solution formed by uniformly mixing 29 g (150 mmol) of tosyl chloride and 30 ml of chloroform were prepared.

While the mixed solution of PEGM and pyridine was stirred at 20° C., a toluene solution of tosyl chloride was dripped to the above mixed solution. After the dripping was completed, a reaction was performed at 40° C. for 2 hours. After the reaction was completed, dilution was performed by adding 150 ml of chloroform, washing was then performed with 250 ml (340 mmol) of a 5%-HCl aqueous solution, and subsequently, washing was further performed with saturated saline solution and water. After a chloroform solution thus obtained was dried with sodium sulfate, the solvent was distilled off using an evaporator, and drying was further performed. The yield was 100%. Peaks of a $^1$H-NMR spectrum were identified (2.4 ppm: methyl group of tosyl group, 3.3 ppm: methyl group of PEGM terminal, 3.6 ppm: EG chain of PEG, 7.3 to 7.8 ppm: benzene ring of tosyl group), so that a tosylated poly(ethylene glycol) was confirmed.

[Synthesis of Compound Having PEG-Branched PEI Structure]

After 23.2 g (4.5 mmol) of the tosylated poly(ethylene glycol) obtained in the above 1-1 and 15.0 g (1.5 mmol) of a branched polyethyleneimine (manufactured by Nippon Shokubai Co., Ltd., EPOMIN SP200) were dissolved in 180 ml of dimethylacetamide (hereinafter referred to as "DMA"), 0.12 g of calcium carbonate was added thereto, and a reaction was performed at 100° C. for 6 hours in a nitrogen atmosphere. After the reaction was completed, a solid residue was removed, and a mixed solvent of 150 ml of ethyl acetate and 450 ml of hexane was added, so that a precipitate was obtained. The precipitate was dissolved in 100 ml of chloroform and was then again re-precipitated by addition of a mixed solvent of 150 ml of ethyl acetate and 450 ml of hexane. Subsequently, filtration was performed, and drying was performed at a reduced pressure. Peaks of a $^1$H-NMR spectrum were identified (2.3 to 2.7 ppm: ethylene of branched PEI, 3.3 ppm: methyl group of PEG terminal, 3.6 ppm: EG chain of PEG), so that a compound having a PEG-branched PEI structure was confirmed. The yield was 99%.

After 10.0 g of silver oxide was added to 138.8 g of an aqueous solution containing 0.592 g of the compound obtained as described above, stirring was performed at 25° C. for 30 minutes. Subsequently, when 46.0 g of dimethylethanolamine was gradually added while stirring was performed, although the color of a reaction solution was turned to dark red, and heat was slightly generated, the stirring was continuously performed at 25° C. for 30 minutes without performing any additional treatments. Subsequently, 15.2 g of a 10%-ascorbinic acid aqueous solution was gradually added while stirring was performed. The stirring was further performed for 20 hours while the temperature was maintained, so that a dark red dispersion was obtained.

After a mixed solvent of 200 ml of isopropyl alcohol and 200 ml of hexane was added to the dispersion obtained by the reaction described above and was stirred for 2 minutes, centrifugal condensation was performed for 5 minutes at 3,000 rpm. After a supernatant was removed, a mixed solvent of 50 ml of isopropyl alcohol and 50 ml of hexane was added to the precipitate, and after stirring was performed for 2 minutes, centrifugal condensation was performed for 5 minutes at 3,000 rpm. After a supernatant was removed, 20 g of water was added to the precipitate and stirred for 2 minutes, and the organic solvent was removed at a reduced pressure, so that a paste of silver nano particles was obtained. Water was added thereto, so that an aqueous dispersion containing approximately 70% of a solid component was obtained.

After the dispersion thus obtained was sampled, a dilutes solution thereof was subjected to visible light absorption spectrum measurement, and a peak of a plasmon absorption spectrum at 400 nm was observed, so that the generation of silver nano particles was confirmed. In addition, by TEM observation, spherical silver nano particles (average particle diameter: 17.5 nm) were confirmed. The silver content in the solid measured using TG-DTA was 97.2%.

<Preparation of Plating Core Ink (b-1) for Reverse Printing>

An ink (b-1) for reverse offset printing which contained silver nano particles as particles to be formed into plating cores was prepared by blending 24% of the aqueous dispersion obtained as described above containing approximately 70% of a solid component, 0.5% of F-555 (fluorine-based surface energy control agent manufactured by DIC Corp.), 0.1% of BYK333 (silicone-based surface energy control agent manufactured by BYK), 74.6% of ethanol, and 0.8% of glycerin.

<Preparation of Plating Core Ink (b') for IJ Printing>

An ink (b') for IJ printing was prepared by blending 43% of the aqueous dispersion of silver nano particles which was obtained as described above and which contained approximately 70% of a solid component, the silver nano particles being protected by an organic compound; 0.1% of KF-351A (silicone-based surface energy control agent manufactured by Shin-Etsu Chemical Co., Ltd.); 18% of ethanol; 27% of 1,3-butylene glycol; 10% of glycerin; and 2% of distilled water.

<Preparation of Plating Core Ink (b-2) for Reverse Printing>

An ink (b-2) for reverse offset printing which contained silver nano particles as particles to be formed into plating cores was prepared by blending 48% of nano silver dispersion Fine Sphere SVE102 manufactured by Nippon Paint Co., Ltd. (solid component: approximately 30%), 1.1% of Megafac F-555 (fluorine-based surface energy control agent manufactured by DIC Corp.), 0.2% of KF96-lcs (silicone-based surface energy control agent manufactured by Shin-Etsu Silicone), 30.2% of ethanol, 20% of isopropyl acetate, and 0.5% of propylene carbonate.

Synthetic Example 1

Synthesis of Urethane Resin (a1-1)

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the terminal was obtained. Subsequently, 44.7 parts by mass of pentaerythritol triacrylate was mixed with the organic solvent solution of the urethane prepolymer so as to allow the urethane prepolymer to react with pentaerythritol triacrylate, so that an organic solvent solution of a urethane resin having a vinyl group and a carboxyl group was obtained. Next, the carboxyl group of the urethane resin was partially or entirely neutralized by adding 14.8 parts by mass of triethylamine to the organic solvent solution of the urethane resin, and 380 parts by mass of water was further added thereto and sufficiently stirred, so that an aqueous dispersion of a urethane resin was obtained. Subsequently, after 8.8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin (a1-1) having a solid component concentration of 30 percent by mass was obtained. The urethane resin (a1-1) thus obtained had an acid value of 30 and a weight average molecular weight of 82,000.

Synthetic Example 2

Synthesis of Urethane Resin (a1-2)

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane prepolymer, and 277 parts by mass of water was further added thereto and sufficiently stirred, so that an aqueous dispersion of a urethane resin having a carboxyl group was obtained. Next, after 8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin (a1-2) having a solid component concentration of 30 percent by mass was obtained. The urethane resin (a1-2) thus obtained had an acid value of 30 and a weight average molecular weight of 55,000.

Synthetic Example 3

Synthesis of Urethane Resin (a1-3)

In a nitrogen-purged container equipped with a thermometer, a nitrogen gas inlet tube, and a stirrer, 100 parts by mass of a polyether polyol (hydroxyl equivalent: 1,000 g/equivalent) obtained by adding propylene oxide to bisphenol A, 21.6 parts by mass of 1,4-cyclohexanedimethanol, 66.8 parts by mass of dicyclohexylmethanediisocyanate were mixed in 178 parts by mass of methyl ethyl ketone and were allowed to react with each other, so that an organic solvent solution of a urethane prepolymer having an isocyanate group at the terminal was obtained. Subsequently, 9.6 parts by mass of methyl ethyl ketone oxime was mixed with the organic solvent solution of the urethane prepolymer to allow the urethane prepolymer to react with methyl ethyl ketone oxime, so that an organic solvent solution of a urethane resin (a1-3) having a blocked isocyanate group was obtained.

Synthetic Example 4

Synthesis of Vinyl Resin (a2-1)

In a reaction container equipped with a stirrer, a reflux cooling tube, a nitrogen gas inlet tube, a thermometer, and dripping funnels, 115 parts by mass of deionized water and 4 parts by mass of Latemul E-118B (manufactured by Kao Corp., effective component: 25 percent by mass) were charged and then heated to 75° C. while nitrogen was blown into the container. While stirring was performed, after a vinyl monomer mixture containing 48 parts by mass of methyl methacrylate, 45 parts by mass of n-butyl acrylate, 2 parts by mass of methacrylic acid, and 5 parts by mass of 2-hydroxyethyl methacrylate and a part (5 parts by mass) of a monomer pre-emulsion obtained by mixing 4 parts by mass of Aqualon KH-1025 (manufactured by Dai-ichi Kogyo Seiyaku Co., Ltd., effective component: 25 percent by mass) and 15 parts by mass of deionized water were charged into the reaction container, 0.1 parts by mass of potassium persulfate was then added, and polymerization was performed for 60 minutes while the temperature in the reaction container was maintained at 75° C. Next, while the temperature in the reaction container was maintained at 75° C., the remaining monomer pre-emulsion (114 parts by mass) and 30 parts by mass of an aqueous solution of potassium persulfate (effective component: 1.0 percent by mass) were dripped over 180 minutes through the respective dripping funnels. After the dripping was completed, stirring was performed for 60 minutes at the same temperature as described above. The temperature in the reaction container was decreased to 40° C., and ammonia water (effective component: 10 percent by mass) was used so that the pH of an aqueous dispersion in the reaction container was set to 8.5. Next, after deionized water was used so that the content of a nonvolatile component was 20 percent by mass, filtration was performed using a 200-mesh filter cloth, thereby obtaining an aqueous dispersion of a vinyl resin (a2-1) having a carboxyl group.

Synthetic Example 5

Synthesis of Vinyl Resin (a2-2)

In a reaction container equipped with a stirrer, a reflux cooling tube, a nitrogen gas inlet tube, a thermometer, and dripping funnels, 115 parts by mass of deionized water and 4 parts by mass of Latemul E-118B (manufactured by Kao Corp., effective component: 25 percent by mass) were charged and then heated to 75° C. while nitrogen was blown into the container. While stirring was performed, after a vinyl monomer mixture containing 46 parts by mass of methyl methacrylate, 45 parts by mass of n-butyl acrylate, 2 parts by mass of methacrylic acid, 5 parts by mass of 2-hydroxyethyl methacrylate, and 2 parts by mass of N-methylolacrylamide and a part (5 parts by mass) of a monomer pre-emulsion obtained by mixing 4 parts by mass of Aqualon KH-1025 (manufactured by Dai-ichi Kogyo Seiyaku Co., Ltd., effective component: 25 percent by mass) and 15 parts by mass of deionized water were charged into the reaction container, 0.1 parts by mass of potassium persulfate was then added, and polymerization was performed for 60 minutes while the temperature in the reaction container was maintained at 75° C. Next, while the temperature in the reaction container was maintained at 75° C., the remaining monomer pre-emulsion (114 parts by mass) and 30 parts by mass of an aqueous solution of potassium persulfate (effective component: 1.0 percent by mass) were dripped over 180 minutes through the respective dripping funnels. After the dripping was completed, stirring was performed for 60 minutes at the same temperature as described above. The temperature in the reaction container was decreased to 40° C., and ammonia water (effective component: 10 percent by mass) was used so that the pH of an aqueous dispersion in the reaction container was set to 8.5. Next, after deionized water was used so that the content of a nonvolatile component was 20 percent by mass, filtration was performed using a 200-mesh filter cloth, thereby obtaining an aqueous dispersion of a vinyl resin (a2-2) having a carboxyl group and a N-methylolacrylamide.

Synthetic Example 6

Synthesis of Vinyl Resin (a2-3)

In a reaction container equipped with a stirrer, a reflux cooling tube, a nitrogen gas inlet tube, a thermometer, and dripping funnels, 115 parts by mass of deionized water and 4 parts by mass of Latemul E-118B (manufactured by Kao Corporation, effective component: 25 percent by mass) were charged and then heated to 75° C. while nitrogen was blown into the container. While stirring was performed, after a vinyl monomer mixture containing 46 parts by mass of methyl methacrylate, 43 parts by mass of n-butyl acrylate, 2 parts by mass of methacrylic acid, 5 parts by mass of 2-hydroxyethyl methacrylate, and 4 parts by mass of diacetone acrylamide and a part (5 parts by mass) of a monomer pre-emulsion obtained by mixing 4 parts by mass of Aqualon KH-1025 (manufactured by Dai-ichi Kogyo Seiyaku Co., Ltd., effective component: 25 percent by mass) and 15 parts by mass of deionized water were charged into the reaction container, 0.1 parts by mass of potassium persulfate was then added, and polymerization was performed for 60 minutes while the temperature in the reaction container was maintained at 75° C. Next, while the temperature in the reaction container was maintained at 75° C., the remaining monomer pre-emulsion (114 parts by mass) and 30 parts by mass of an aqueous solution of potassium persulfate (effective component: 1.0 percent by mass) were dripped over 180 minutes through the respective dripping funnels. After the dripping was completed, stirring was performed for 60 minutes at the same temperature as described above. The temperature in the reaction container was decreased to 40° C., and ammonia water (effective component: 10 percent by mass) was used so that the pH of an aqueous dispersion in the reaction container was set to 8.5. Next, after deionized water was used so that the content of a nonvolatile compo- nent was 20 percent by mass, filtration was performed using a 200-mesh filter cloth, thereby obtaining an aqueous dispersion of a vinyl resin (a2-3) having a carboxyl group and a keto group.

Synthetic Example 7

Synthesis of Vinyl Resin (a2-4)

In a reaction container equipped with a stirrer, a reflux cooling tube, a nitrogen gas inlet tube, a thermometer, and a dripping funnel, a vinyl monomer mixture containing 48 parts by mass of methyl methacrylate, 43 parts by mass of n-butyl acrylate, 5 parts by mass of 2-hydroxyethyl methacrylate, and 4 parts by mass of "Karenz MOI-BM" (manufactured by Showa Denko K.K., blocked isocyanate group-containing vinyl monomer) and 400 parts by mass of ethyl acetate were mixed together, and the temperature was increased to 50° C. while stirring was performed in a nitrogen atmosphere. Subsequently, 2 parts by mass of 2,2'-azobis(2-methylbutyronitrile) was charged and was subjected to a reaction for 24 hours, so that 500 parts by mass of an ethyl acetate solution of a vinyl resin (a2-4) (nonvolatile component: 20 percent by mass) was obtained, the solution being a mixture of ethyl acetate and a vinyl polymer having a blocked isocyanate group and a weight average molecular weight of 400,000.

Synthetic Example 8

Synthesis of Vinyl Resin (a2-5)

In a reaction container equipped with a stirrer, a reflux cooling tube, a nitrogen gas inlet tube, a thermometer, and a dripping funnel, a vinyl monomer mixture containing 48 parts by mass of methyl methacrylate, 43 parts by mass of n-butyl acrylate, 5 parts by mass of 2-hydroxyethyl methacrylate, and 4 parts by mass of glycidyl methacrylate and 400 parts by mass of ethyl acetate were mixed together, and the temperature was increased to 50° C. while stirring was performed in a nitrogen atmosphere. Subsequently, 2 parts by mass of 2,2'-azobis(2-methylbutyronitrile) was charged and was subjected to a reaction for 24 hours, so that 500 parts by mass of an ethyl acetate solution of a vinyl resin (a2-5) (nonvolatile component: 20 percent by mass) was obtained, the solution being a mixture of ethyl acetate and a vinyl polymer having a glycidyl group and a weight average molecular weight of 400,000.

Synthetic Example 9

Synthesis of Vinyl Resin (a2-6)

In a reaction container equipped with a stirrer, a reflux cooling tube, a nitrogen gas inlet tube, a thermometer, and a dripping funnel, a vinyl monomer mixture containing 48 parts by mass of methyl methacrylate, 45 parts by mass of n-butyl acrylate, 5 parts by mass of 2-hydroxyethyl methacrylate, and 2 parts by mass of maleic anhydride and 400 parts by mass of ethyl acetate were mixed together, and the temperature was increased to 50° C. while stirring was performed in a nitrogen atmosphere. Subsequently, 2 parts by mass of 2,2'-azobis(2-methylbutyronitrile) was charged and was subjected to a reaction for 24 hours, so that 500 parts by mass of an ethyl acetate solution of a vinyl resin (a2-6) (nonvolatile component: 20 percent by mass) was obtained, the solution being a mixture of ethyl acetate and a vinyl polymer having a carboxylic anhydride group and a weight average molecular weight of 400,000.

Synthetic Example 10

Synthesis of Composite Resin Particles 1 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane prepolymer, and 277 parts by mass of water was further added thereto and sufficiently stirred, so that an aqueous dispersion of a urethane resin having a carboxyl group was obtained. Next, after 8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30 and a weight average molecular weight of 55,000.

In a reaction container equipped with a stirrer, a reflux cooling tube, a nitrogen gas inlet tube, a thermometer, a monomer-mixture dripping funnel, and a polymerization catalyst dripping funnel, 280 parts by mass of deionized water and 333 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer mixture containing 48 parts by mass of methyl methacrylate, 44 parts by mass of n-butyl acrylate, and 8 parts by mass of 2-hydroxyethyl methacrylate and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and the temperature in the reaction container was then decreased to 40° C. Subsequently, after deionized water was used so that the content of a nonvolatile component was 20 percent by mass, filtration was performed using a 200-mesh filter cloth, and as a result, an aqueous dispersion of composite resin particles 1 each formed of a shell layer of the urethane resin and a core layer of a vinyl polymer having a carboxyl group was obtained.

Synthetic Example 11

Synthesis of Composite Resin Particles 2 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane prepolymer, and 277 parts by mass of water was further added thereto and sufficiently stirred, so that an aqueous dispersion of a urethane resin having a carboxyl group was obtained. Next, after 8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30 and a weight average molecular weight of 55,000.

In a reaction container equipped with a stirrer, a reflux cooling tube, a nitrogen gas inlet tube, a thermometer, a monomer-mixture dripping funnel, and a polymerization catalyst dripping funnel, 280 parts by mass of deionized water and 333 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer pre-emulsion obtained by mixing a monomer mixture containing 46 parts by mass of methyl methacrylate, 45 parts by mass of n-butyl acrylate, 2 parts by mass of methacrylic acid, 4 parts by mass of 2-hydroxyethyl methacrylate, and 4 parts by mass of N-n-butoxymethyl acrylamide; 4 parts by mass of Aqualon KH-1025 (manufactured by Dai-ichi Kogyo Seiyaku Co., Ltd., effective component: 25 percent by mass); and 15 parts by mass of deionized water and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and the temperature in the reaction container was then decreased to 40° C. Subsequently, after deionized water was used so that the content of a nonvolatile component was 20 percent by mass, filtration was performed using a 200-mesh filter cloth, and as a result, an aqueous dispersion of composite resin particles 2 each formed of a shell layer of the urethane resin and a core layer of a vinyl polymer having a carboxyl group and an N-n-butoxymethyl acrylamide group was obtained.

Synthetic Example 12

Synthesis of Composite Resin Particles 3 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane prepolymer, and 277 parts by mass of water was further added thereto and sufficiently stirred, so that an aqueous dispersion of a urethane resin having a carboxyl group was obtained. Next, after 8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30 and a weight average molecular weight of 55,000.

In a reaction container equipped with a stirrer, a reflux cooling tube, a nitrogen gas inlet tube, a thermometer, a monomer-mixture dripping funnel, and a polymerization catalyst dripping funnel, 280 parts by mass of deionized water and 400 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer mixture containing 34 parts by mass of methyl methacrylate, 30 parts by mass of n-butyl acrylate, 6 parts by mass of 2-hydroxyethyl methacrylate, and 10 parts by mass of diacetone acrylamide and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and the temperature in the reaction container was then decreased to 40° C. Subsequently, after deionized water was used so that the content of a nonvolatile component was 20 percent by mass, filtration was performed using a 200-mesh filter cloth, and as a result, an aqueous dispersion of composite resin particles 3 each formed of a shell layer of the urethane resin and a core layer of a vinyl polymer having a carboxyl group and a keto group was obtained.

Synthetic Example 13

Synthesis of Composite Resin Particles 4 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, hydroxyl equivalent: 1,000 g/equivalent), 17.4 parts by mass of 2,2-dimethylolpropionic acid, 21.7 parts by mass of 1,4-cyclohexanedimethanol, and 106.2 parts by mass of dicyclohexylmethanediisocyanate were mixed in 178 parts by mass of methyl ethyl ketone and were allowed to react with each other, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane prepolymer, and 277 parts by mass of water was further added thereto and sufficiently stirred, so that an aqueous dispersion of a urethane resin having a carboxyl group was obtained. Next, after 8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30 and a weight average molecular weight of 55,000.

In a reaction container equipped with a stirrer, a reflux cooling tube, a nitrogen gas inlet tube, a thermometer, a monomer-mixture dripping funnel, and a polymerization catalyst dripping funnel, 280 parts by mass of deionized water and 400 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer mixture containing 36 parts by mass of methyl methacrylate, 34 parts by mass of n-butyl acrylate, 6 parts by mass of 2-hydroxyethyl methacrylate, and 4 parts by mass of glycidyl methacrylate and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and the temperature in the reaction container was then decreased to 40° C. Subsequently, after deionized water was used so that the content of a nonvolatile component was 20 percent by mass, filtration was performed using a 200-mesh filter cloth, and as a result, an aqueous dispersion of composite resin particles 4 each formed of a shell layer of the urethane resin and a core layer of a vinyl polymer having a glycidyl group was obtained.

Synthetic Example 14

Synthesis of Composite Resin Particles 5 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, content of an aliphatic cyclic structure in the polyester polyol was 1,426 mmol/kg, hydroxyl equivalent: 1,000 g/equivalent), 17.6 parts by mass of 2,2-dimethylolpropionic acid, 21.7 parts by mass of 1,4-cyclohexanedimethanol, and 106.2 parts by mass of dicyclohexylmethanediisocyanate were allowed to react with each other in a mixed solvent containing 178 parts by mass of methyl ethyl ketone, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane resin, and 380 parts by mass of water was further added thereto and sufficiently stirred, so that an aqueous dispersion of a urethane resin having an aliphatic cyclic structure and a carboxyl group was obtained. Next, after 8.8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30, an aliphatic cyclic structure content of 4,452 mmol/kg, which was calculated from the ratio of charged raw materials, and a weight average molecular weight of 53,000.

In a reaction container equipped with a stirrer, a reflux cooling tube, a nitrogen gas inlet tube, a thermometer, a monomer-mixture dripping funnel, and a polymerization catalyst dripping funnel, 140 parts by mass of deionized water and 100 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer mixture containing 50.0 parts by mass of methyl methacrylate, 30.0 parts by mass of n-butyl acrylate, and 20.0 parts by mass of N-n-butoxymethyl acrylamide and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and as a result, an aqueous dispersion of composite resin particles each formed of a shell layer of the urethane resin and a core layer of the vinyl polymer was obtained.

After the temperature in the reaction container was decreased to 40° C., and deionized water was used so that the content of a nonvolatile component was 20.0 percent by mass, filtration was performed using a 200-mesh filter cloth, so that an aqueous dispersion of composite resin particles 5 used in the present invention was obtained.

Synthetic Example 15

Synthesis of Composite Resin Particles 6 of Urethane Resin and Vinyl Resin

In a nitrogen-purged container equipped with a thermometer, a nitrogen gas inlet tube, and a stirrer, 100 parts by mass of a polyester polyol (polyester polyol obtained by a reaction among 1,4-cyclohexanedimethanol, neopentyl glycol, and adipic acid, content of an aliphatic cyclic structure in the polyester polyol was 1,426 mmol/kg, hydroxyl equivalent: 1,000 g/equivalent), 17.6 parts by mass of 2,2-dimethylolpropionic acid, 21.7 parts by mass of 1,4-cyclohexanedimethanol, and 106.2 parts by mass of dicyclohexylmethanediisocyanate were allowed to react with each other in a mixed solvent containing 178 parts by mass of methyl ethyl ketone, so that an organic solvent solution of a urethane prepolymer having an isocyanate group at the molecular terminal was obtained. Subsequently, the carboxyl group of the urethane resin was partially or entirely neutralized by adding 13.3 parts by mass of triethylamine to the organic solvent solution of the urethane resin, and 380 parts by mass of water was further added thereto and sufficiently stirred, so that an aqueous dispersion of a urethane resin having an aliphatic cyclic structure and a carboxyl group was obtained. Next, after 8.8 parts by mass of an ethylenediamine aqueous solution at a concentration of 25 percent by mass was added to the above aqueous dispersion and stirred so as to chain extend a particulate polyurethane resin, aging and solvent removal were performed, so that an aqueous dispersion of a urethane resin having a solid component concentration of 30 percent by mass was obtained. The urethane resin thus obtained had an acid value of 30, an aliphatic cyclic structure content of 4,452 mmol/kg, which was calculated from the ratio of charged raw materials, and a weight average molecular weight of 53,000.

In a reaction container equipped with a stirrer, a reflux cooling tube, a nitrogen gas inlet tube, a thermometer, a monomer-mixture dripping funnel, and a polymerization catalyst dripping funnel, 140 parts by mass of deionized water and 100 parts by mass of the aqueous dispersion of the urethane resin obtained as described above were charged, and the temperature was increased to 80° C. while a nitrogen gas was blown into the container. In order to obtain a vinyl polymer forming a core layer, while stirring was performed, in the reaction container, the temperature of which was increased to 80° C., a monomer mixture containing 40.0 parts by mass of methyl methacrylate, 30.0 parts by mass of n-butyl acrylate, 20.0 parts by mass of N-n-butoxymethyl acrylamide, and 10.0 parts by mass of 2-hydroxyethyl methacrylate and 20 parts by mass of an ammonium persulfate aqueous solution (concentration: 0.5 percent by mass) were dripped through the respective dripping funnels over 120 minutes for polymerization while the temperature in the reaction container was maintained at 80° C.±2° C. After the dripping was completed, stirring was performed for 60 minutes at the same temperature as described above, and as a result, an aqueous dispersion of composite resin particles each formed of a shell layer of the urethane resin and a core layer of the vinyl polymer was obtained. After the temperature in the reaction container was decreased to 40° C., and deionized water was used so that the content of a nonvolatile component was 20.0 percent by mass, filtration was performed using a 200-mesh filter cloth, so that an aqueous dispersion of composite resin particles 6 used in the present invention was obtained.

Examples 1 to 15

The composition obtained in each of the synthetic examples 1 to 15 was applied on a surface of an object on which printing was to be performed (substrate) which is formed of a polyimide film (Kapton200H manufactured by DU PONT-TORAY Co., Ltd.) using a spin coater to have a dried thickness of 0.1 μm and was then dried using a hot wind dryer, so that a receiving layer (A) was formed on the surface of the object on which printing was to be performed (substrate).

By the use of the plating core ink (b-1) for reverse printing and a glass-made relief plate having line concave portions (negative pattern) each having a width of approximately 20 μm, a plating core pattern formed of lines each having a width of approximately 20 μm was formed on the polyimide film provided with the receiving layer in accordance with the following reverse offset printing procedure.

After the ink was applied by a slit coater on a silicone smooth surface which was to be used as a release surface of a blanket at an ambient temperature of 25° C. and a relative humidity of 48% so as to obtain a wet thickness of approximately 2 μm, the ink was left for 1 minute (waiting time) for spontaneous drying. Subsequently, a glass-made relief plate having a negative pattern, which functioned as the relief plate, was lightly brought into contact with an ink coating surface on the blanket and was then withdrawn therefrom to remove the ink, so that a line pattern having a width of approximately 20 μm was formed on the blanket. The removal of the ink performed by the relief plate was preferably performed so that a line having a sharp edge could be formed. Next, an ink pattern formed on the blanket was pressed to the polyimide film which functioned as the object on which printing was to be performed and which was provided with the receiving layer, and drying was performed at 150° C. for 1 hour, thereby obtaining a plating core pattern.

Next, the surface of the plating core pattern was treated by a corona discharge process using AP-T01 (manufactured by Sekisui Chemical Co., Ltd., normal pressure plasma processing apparatus, gas: air (oxygen concentration: approximately 21 percent by mass), flow rate: 20 liters/min, output: 150 W, treatment time: 5 seconds).

Next, the treated surface of the plating core pattern was set as a cathode, phosphorus-containing copper was set as an anode, and electrolytic plating was performed at a current density of 2 A/dm$^2$ for 15 minutes using an electrolytic plating liquid containing copper sulfate, so that a copper plating layer was laminated on the surface of the layer treated by the plasma discharge process. As the electrolytic plating liquid, 70 g/liter of copper sulfate, 200 g/liter of sulfuric acid, 50 mg/liter of chlorine ions, and 5 g/liter of Top Lucina SF (gloss agent manufactured by Okuno Chemical Industries Co., Ltd.) were used. By the method described above, an electrically conductive ultrafine pattern formed by laminating the substrate, the receiving layer, and the plating core pattern, and a layer corresponding to the plating layer was obtained.

Examples 16 and 17

The composition obtained in each of the synthetic examples 14 and 15 was applied using a spin coater in a manner similar to that of Examples 1 to 15 to have a dried thickness of 0.1 μm, and drying was then performed using a hot wind drier, so that a receiving layer was formed on the surface of the object on which printing was to be performed.

Except that the plating core ink (b-2) for reverse printing was used instead of using the plating core ink (b-1) for reverse printing, an electrically conductive pattern was obtained in a manner similar to that of Examples 1 to 15.

Comparative Examples 1 to 15

The composition obtained in each of the synthetic examples 1 to 15 was applied on a surface of an object on which printing was to be performed which was formed of a polyimide film (Kapton200H manufactured by DU PONT-TORAY Co., Ltd.) using a spin coater to have a dried thickness of 0.1 μm and was then dried using a hot wind dryer, so that a receiving layer was formed on the surface of the object on which printing was to be performed.

The plating core ink (b') for IJ printing was printed using an ink-jet printer (ink-jet evaluation device EB150 manufactured by Konica Minolta IJ Technologies, Inc., evaluation printer head KM512M) and was then dried at 150° C. for 1 hour, so that a line plating core pattern having a line width of approximately 100 μm was formed on the polyimide film provided with the receiving layer.

Next, the surface of the plating core pattern was treated by a corona discharge process using AP-T01 (manufactured by Sekisui Chemical Co., Ltd., normal pressure plasma processing apparatus, gas: air (oxygen concentration: approximately 21 percent by mass), flow rate: 20 liters/min, output: 150 W, treatment time: 5 seconds).

Next, the treated surface of the plating core pattern was set as a cathode, phosphorus-containing copper was set as an anode, and electrolytic plating was performed at a current density of 2 A/dm for 15 minutes using an electrolytic plating liquid containing copper sulfate, so that a copper plating layer having a thickness of 8 μm was laminated on the surface of the layer treated by the plasma discharge process. As the electrolytic plating liquid, 70 g/liter of copper sulfate, 200 g/liter of sulfuric acid, 50 mg/liter of chlorine ions, and 5 g/liter of Top Lucina SF (gloss agent manufactured by Okuno Chemical Industries Co., Ltd.) were used. By the method described above, an electrically conductive pattern formed by laminating the object on which printing was to be performed, the receiving layer, the plating core pattern, and a layer corresponding to the plating layer was obtained.

Comparative Example 16

Except that the receiving layer was not used, the formation of an electrically conductive pattern was tried by a method similar to that of Examples 1 to 15.

Comparative Example 17

Except that the receiving layer was not used, the formation of an electrically conductive pattern was tried by a method similar to that of Examples 16 and 17.

[Method for Evaluating Adhesion of Plating Core Pattern]

After a cellophane adhesive tape (manufactured by Nichiban Co., Ltd., CT405AP-24, 24 mm) was pressure bonded on a surface of the plating core pattern with a finger, the cellophane adhesive tape was peeled away in a 90-degree direction with respect to the surface of the plating core pattern. The adhesive surface of the cellophane tape thus peeled was observed by visual inspection, and the adhesion was evaluated based on the presence or absence of a substance adhering to the surface thereof.

The case in which the plating core pattern was not adhered at all to the adhesive surface of the peeled cellophane adhesive tape was evaluated as "A"; the case in which less than 3% of the plating core pattern with respect to the area at which the plating core pattern and the adhesive tape were in contact with each other was peeled away from the receiving layer and was adhered to the adhesive surface of the adhesive tape was evaluated as "B"; the case in which 3% to less than 30% of the plating core pattern with respect to the area at which the plating core pattern and the adhesive tape were in contact with each other was peeled away from the receiving layer and was adhered to the adhesive surface of the adhesive tape was evaluated as "C"; and the case in which 30% or more of the plating core pattern with respect to the area at which the plating core pattern and the adhesive tape were in contact with each other was peeled away from the receiving layer and was adhered to the adhesive surface of the adhesive tape was evaluated as "D".

[Method for Evaluating Cross-Sectional Shape of Electrically Conductive Ultrafine Pattern]

The cross-sectional shape of the obtained electrically conductive pattern was observed using an optical interference microscope (manufactured by Ryoka Systems Inc., Micromap). A flat cross-sectional shape of the electrically conductive pattern was evaluated as "○", and a concave (coffee ring shape) or a convex (semi-cylindrical shape) cross-sectional shape of the electrically conductive pattern was evaluated as "x".

[Method for Evaluating Adhesion of Electrically Conductive Ultrafine Pattern]

After the electrically conductive ultrafine pattern obtained as described above was bent at an angle of 180° so that the plating layer was located at the outer side, the electrically conductive ultrafine pattern was returned to the state before bending. In this step, the case in which no peeling of the electrically conductive ultrafine pattern was confirmed by visual inspection was evaluated as "A"; the case in which the electrically conductive ultrafine pattern was only slightly peeled was evaluated as "B"; the case in which the electrically conductive ultrafine pattern was partially peeled was evaluated as "C"; and the case in which in the plating step described above, the plating core pattern is partially peeled away from the receiving layer was evaluated as "D".

The results of the above evaluations are shown in Tables 1 and 2.

TABLE 1

|  | EXAMPLE 1 | EXAMPLE 2 | EXAMPLE 3 | EXAMPLE 4 | EXAMPLE 5 |
|---|---|---|---|---|---|
| RESIN COMPOSITION | SYNTHETIC EXAMPLE 1 | SYNTHETIC EXAMPLE 2 | SYNTHETIC EXAMPLE 3 | SYNTHETIC EXAMPLE 4 | SYNTHETIC EXAMPLE 5 |
| PLATING CORE INK | PLATING CORE INK (b-1) FOR REVERSE PRINTING | | | | |
| ADHESION OF PLATING CORE PATTERN | A | B | B | B | A |
| CROSS-SECTIONAL SHAPE OF ELECTRICALLY CONDUCTIVE ULTRAFINE PATTERN | ○ | ○ | ○ | ○ | ○ |
| ADHESION OF ELECTRICALLY CONDUCTIVE ULTRAFINE PATTERN | A | B | B | B | A |

|  | EXAMPLE 6 | EXAMPLE 7 | EXAMPLE 8 | EXAMPLE 9 | EXAMPLE 10 |
|---|---|---|---|---|---|
| RESIN COMPOSITION | SYNTHETIC EXAMPLE 6 | SYNTHETIC EXAMPLE 7 | SYNTHETIC EXAMPLE 8 | SYNTHETIC EXAMPLE 9 | SYNTHETIC EXAMPLE 10 |
| PLATING CORE INK | PLATING CORE INK (b-1) FOR REVERSE PRINTING | | | | |
| ADHESION OF PLATING CORE PATTERN | A | B | A | A | B |

TABLE 1-continued

|  | | | | | |
|---|---|---|---|---|---|
| CROSS-SECTIONAL SHAPE OF ELECTRICALLY CONDUCTIVE ULTRAFINE PATTERN | ○ | ○ | ○ | ○ | ○ |
| ADHESION OF ELECTRICALLY CONDUCTIVE ULTRAFINE PATTERN | A | B | A | B | B |

|  | EXAMPLE 11 | EXAMPLE 12 | EXAMPLE 13 | EXAMPLE 14 | EXAMPLE 15 |
|---|---|---|---|---|---|
| RESIN COMPOSITION | SYNTHETIC EXAMPLE 11 | SYNTHETIC EXAMPLE 12 | SYNTHETIC EXAMPLE 13 | SYNTHETIC EXAMPLE 14 | SYNTHETIC EXAMPLE 15 |
| PLATING CORE INK | PLATING CORE INK (b-1) FOR REVERSE PRINTING | | | | |
| ADHESION OF PLATING CORE PATTERN | A | B | A | A | B |
| CROSS-SECTIONAL SHAPE OF ELECTRICALLY CONDUCTIVE ULTRAFINE PATTERN | ○ | ○ | ○ | ○ | ○ |
| ADHESION OF ELECTRICALLY CONDUCTIVE ULTRAFINE PATTERN | A | A | A | A | A |

|  | EXAMPLE 16 | EXAMPLE 17 |
|---|---|---|
| RESIN COMPOSITION | SYNTHETIC EXAMPLE 14 | SYNTHETIC EXAMPLE 15 |
| PLATING CORE INK | PLATING CORE INK (b-2) FOR REVERSE PRINTING | |
| ADHESION OF PLATING CORE PATTERN | B | B |
| CROSS-SECTIONAL SHAPE OF ELECTRICALLY CONDUCTIVE ULTRAFINE PATTERN | ○ | ○ |
| ADHESION OF ELECTRICALLY CONDUCTIVE ULTRAFINE PATTERN | C | C |

TABLE 2

|  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|
| RESIN COMPOSITION | SYNTHETIC EXAMPLE 1 | SYNTHETIC EXAMPLE 2 | SYNTHETIC EXAMPLE 3 | SYNTHETIC EXAMPLE 4 | SYNTHETIC EXAMPLE 5 |
| PLATING CORE INK | PLATING CORE INK (b') FOR IJ PRINTING | | | | |
| ADHESION OF PLATING CORE PATTERN | A | B | B | B | A |
| CROSS-SECTIONAL SHAPE OF ELECTRICALLY CONDUCTIVE ULTRAFINE PATTERN | X | X | X | X | X |
| ADHESION OF ELECTRICALLY CONDUCTIVE ULTRAFINE PATTERN | A | B | B | B | A |

|  | COMPARATIVE EXAMPLE 6 | COMPARATIVE EXAMPLE 7 | COMPARATIVE EXAMPLE 8 | COMPARATIVE EXAMPLE 9 | COMPARATIVE EXAMPLE 10 |
|---|---|---|---|---|---|
| RESIN COMPOSITION | SYNTHETIC EXAMPLE 6 | SYNTHETIC EXAMPLE 7 | SYNTHETIC EXAMPLE 8 | SYNTHETIC EXAMPLE 9 | SYNTHETIC EXAMPLE 10 |
| PLATING CORE INK | PLATING CORE INK (b') FOR IJ PRINTING | | | | |
| ADHESION OF PLATING CORE PATTERN | A | B | A | A | B |
| CROSS-SECTIONAL SHAPE OF ELECTRICALLY CONDUCTIVE ULTRAFINE PATTERN | X | X | X | X | X |
| ADHESION OF ELECTRICALLY CONDUCTIVE ULTRAFINE PATTERN | A | B | A | B | B |

|  | COMPARATIVE EXAMPLE 11 | COMPARATIVE EXAMPLE 12 | COMPARATIVE EXAMPLE 13 | COMPARATIVE EXAMPLE 14 | COMPARATIVE EXAMPLE 15 |
|---|---|---|---|---|---|
| RESIN COMPOSITION | SYNTHETIC EXAMPLE 11 | SYNTHETIC EXAMPLE 12 | SYNTHETIC EXAMPLE 13 | SYNTHETIC EXAMPLE 14 | SYNTHETIC EXAMPLE 15 |
| PLATING CORE INK | PLATING CORE INK (b') FOR IJ PRINTING | | | | |
| ADHESION OF PLATING CORE PATTERN | A | A | A | A | A |

TABLE 2-continued

| | | | | | |
|---|---|---|---|---|---|
| CROSS-SECTIONAL SHAPE OF ELECTRICALLY CONDUCTIVE ULTRAFINE PATTERN | X | X | X | X | X |
| ADHESION OF ELECTRICALLY CONDUCTIVE ULTRAFINE PATTERN | A | A | A | A | A |

| | COMPARATIVE EXAMPLE 11 | COMPARATIVE EXAMPLE 12 |
|---|---|---|
| RESIN COMPOSITION | NONE | NONE |
| PLATING CORE INK | (b-1) | (b-2) |
| ADHESION OF PLATING CORE PATTERN | C | D |
| CROSS-SECTIONAL SHAPE OF ELECTRICALLY CONDUCTIVE ULTRAFINE PATTERN | ○ | ○ |
| ADHESION OF ELECTRICALLY CONDUCTIVE ULTRAFINE PATTERN | D | D |

INDUSTRIAL APPLICABILITY

The electrically conductive ultrafine pattern formed by the pattern forming method of the present invention can be used for applications of a circuit forming substrate used for an electric circuit, an integrated circuit, or the like; an organic solar cell and an electronic book terminal; an organic EL, an organic transistor, a flexible printed circuit board, a RFID, wires forming electromagnetic wave shielding or the like, a flexible printed circuit board (FPC), tape automatic bonding (TAB), a chip on film (COF), a printed wire board (PWB), or the like.

REFERENCE SIGNS LIST

1 ink film
2 blanket
3 relief plate
4 ink pattern-receiving member

The invention claimed is:

1. A method for forming an electrically conductive ultrafine pattern, the method comprising:
   (1) a step of applying a resin composition (a) to form a receiving layer (A) on a substrate;
   (2) a step of printing an ink (b) containing particles (b1), thereby forming a core pattern (B) made of the ink (b) on the receiving layer (A) by a reverse offset printing method,
   (3) firing or drying the printed core pattern (B) made of the particles (b1) which has been obtained at the step (2) to be a target core pattern for electrolytic plating on the receiving layer (A); and
   (4) a step of depositing a metal on the target core pattern formed in the step (3), thereby plating the target core pattern on the receiving layer (A) by an electrolytic plating method,
   wherein the resin composition (a) includes a urethane resin (a1) having a weight average molecular weight of 5,000 or more or a vinyl resin (a2), and a medium (a3),
   wherein the urethane resin (a1) has a hydrophilic group and 2,000 to 5,500 mmol/kg of an aliphatic cyclic structure with respect to the total mass,
   wherein the vinyl resin (a2) is a vinylic copolymer containing 10 to 70 percent by mass of methyl methacrylate and 10 to 50 percent by mass of an alkyl (meth)acrylate having an alkyl group with 2 to 12 carbon atoms, and
   wherein the ink (b) contains metal nano particles as the particles (b1) and an organic compound containing a basic nitrogen atom, the metal nano particles being protected by the organic compound and dispersed in the ink (b), and the urethane resin (a1) or the vinyl resin (a2) in the resin composition (a) has a functional group capable of performing a cross-linking reaction with the organic compound which protects the metal nano particles,
   wherein the resin composition (a) includes composite resin particles each composed of a shell layer formed of the urethane resin (a1) and a core layer formed of the vinyl resin (a2).

2. The method for forming an electrically conductive ultrafine pattern according to claim 1, wherein the metal nano particles have a volume average particle diameter (Mv) of 2 to 100 nm.

3. The method for forming an electrically conductive ultrafine pattern according to claim 1, wherein the ink (b) further contains a fluorine-based surface energy control agent and/or a silicone-based surface energy control agent.

4. The method for forming an electrically conductive ultrafine pattern according to claim 1, wherein the reverse offset printing method is a printing method comprising:
   (i) forming a uniform ink film of the ink (b) on a liquid-repellent surface of a blanket;
   (ii) pressing a relief plate on a surface of the ink film to remove an ink at a portion in contact with the relief plate, wherein an ink remaining on the blanket forms the core pattern (B); and
   (iii) then transferring the ink remaining on the blanket to the receiving layer (A) formed on the substrate.

5. A method for forming an electric circuit comprising an electrically conductive ultrafine pattern, wherein the electrically conductive ultrafine pattern of the electric circuit is formed by the method according to claim 1.

* * * * *